United States Patent [19]

Nagai et al.

[11] Patent Number: 4,885,628
[45] Date of Patent: Dec. 5, 1989

[54] SEMICONDUCTOR INTEGRATED CIRCUIT DEVICE

[75] Inventors: Yasuo Nagai, Maebashi; Isao Shimizu, Tamamura; Masatoshi Kimura, Ohme; Kenji Kaneko, Sagamihara; Takeaki Okabe; Koozoo Sakamoto, both of Tokyo, all of Japan

[73] Assignee: Hitachi, Ltd., Tokyo, Japan

[21] Appl. No.: 349,926

[22] Filed: May 8, 1989

Related U.S. Application Data

[60] Continuation of Ser. No. 39,118, Apr. 16, 1987, abandoned, which is a division of Ser. No. 768,320, Aug. 22, 1985, abandoned.

[30] Foreign Application Priority Data

Aug. 22, 1984 [JP] Japan ................................ 59-173244
Aug. 22, 1984 [JP] Japan ................................ 59-173245
Aug. 22, 1984 [JP] Japan ................................ 59-173246

[51] Int. Cl.$^4$ ................ H01L 23/48; H01L 29/46; H01L 29/62
[52] U.S. Cl. ............................ 357/68; 357/40; 357/41; 357/53; 357/71
[58] Field of Search ................ 357/68, 53, 44, 40, 357/41, 45, 71

[56] References Cited

U.S. PATENT DOCUMENTS

| | | | |
|---|---|---|---|
| 4,194,214 | 3/1980 | Awane et al. | 357/41 |
| 4,514,749 | 4/1985 | Shoji | 357/68 |
| 4,628,343 | 12/1986 | Komatsu | 357/68 X |

Primary Examiner—Andrew J. James
Assistant Examiner—Sara W. Crane
Attorney, Agent, or Firm—Antonelli, Terry & Wands

[57] ABSTRACT

A semiconductor integrated circuit device includes a high voltage circuit and a high-speed signal processing circuit on the same chip. The high-speed signal processing circuit is made to have a stacked construction thereby to reduce the power consumption. It is also surrounded by ground potential lines so that it may be prevented from being adversely affected by a high voltage used in the high voltage circuit. Each of the high voltage elements composing the high voltage circuit has its principal surface formed at its base and collector regions with guard ring layers of the same conduction types as the respective ones of the high voltage elements. The guard ring layers extend over the elements and the semiconductor body and have lower impurity concentrations than the respective ones of the elements.

8 Claims, 26 Drawing Sheets

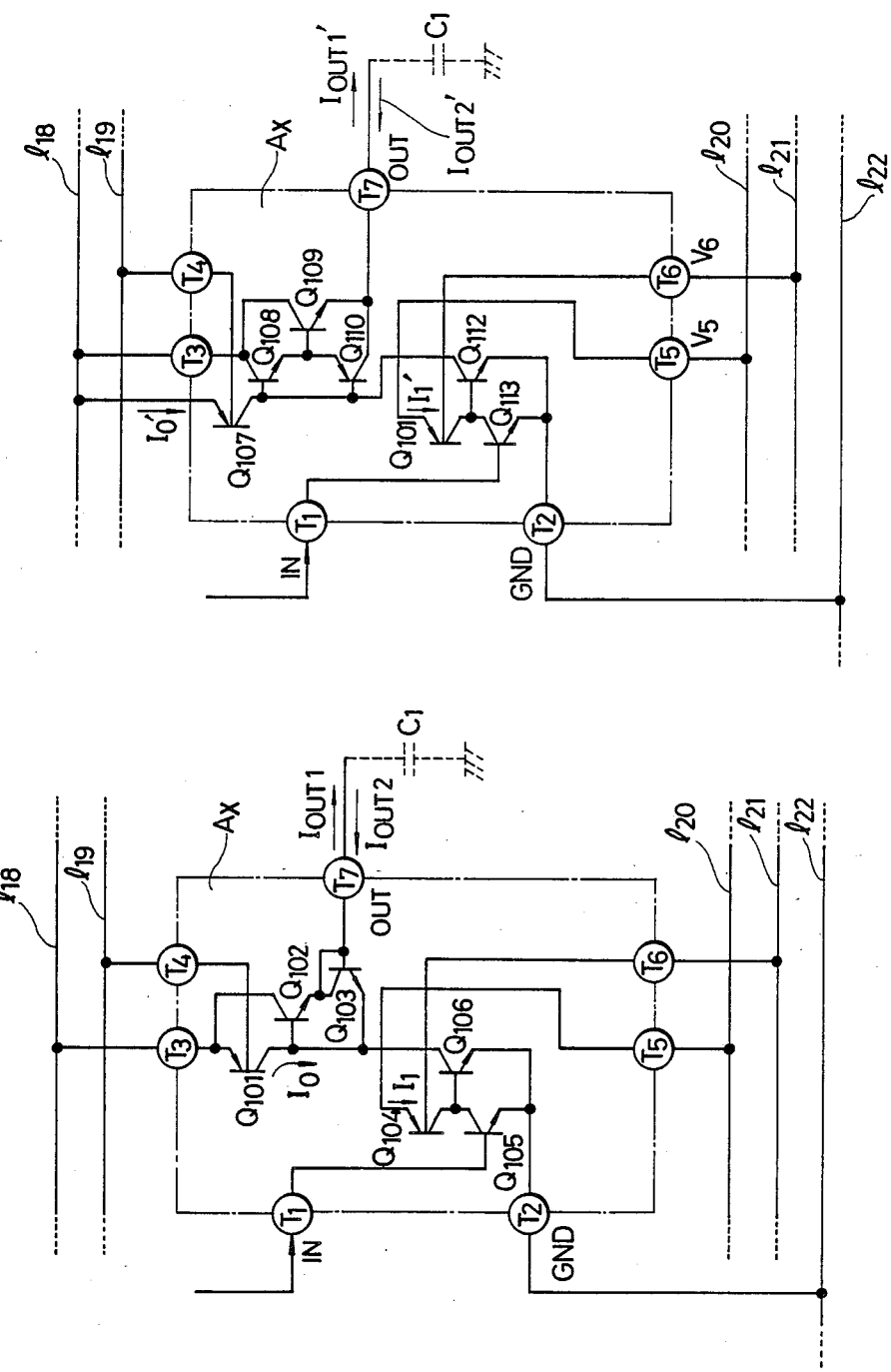

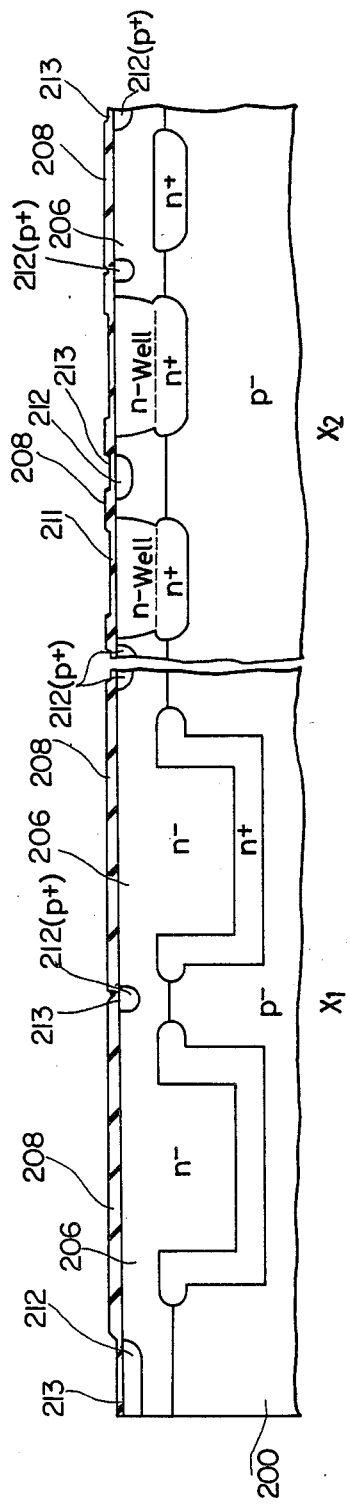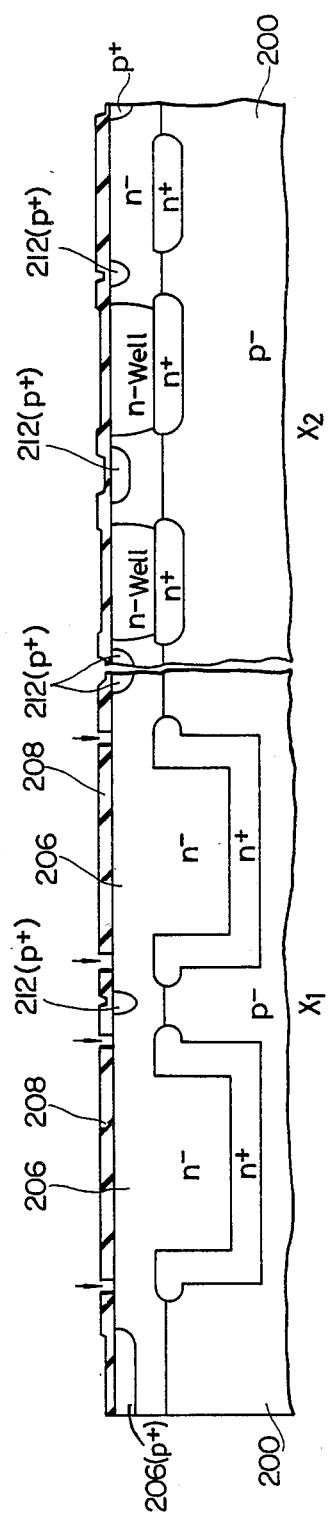

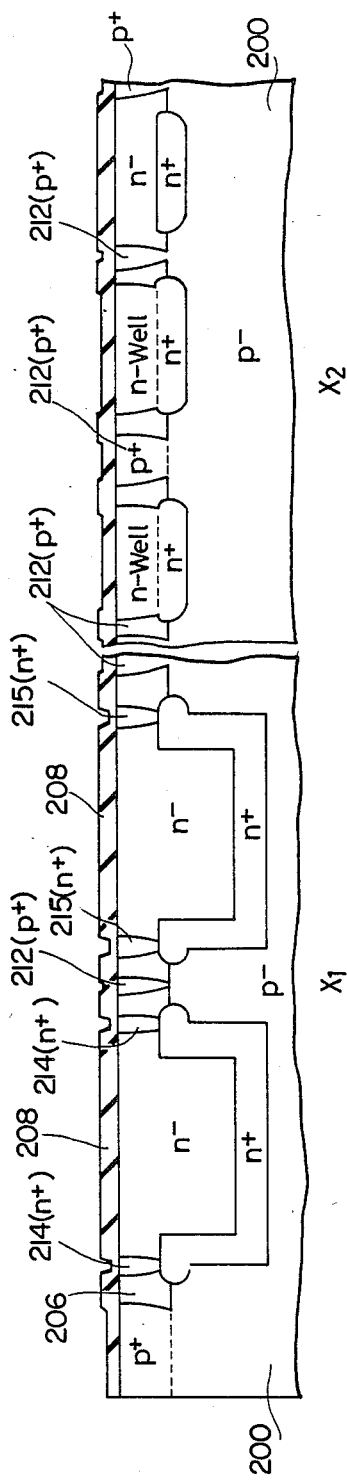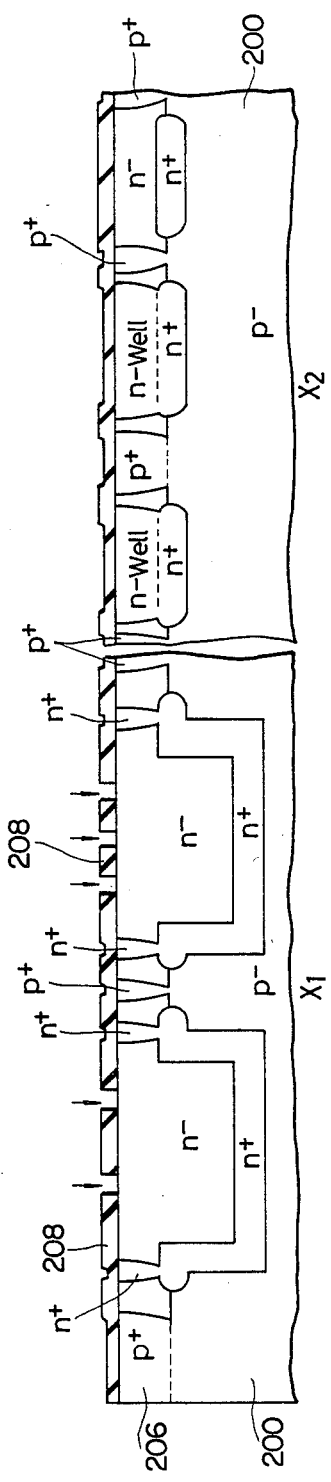

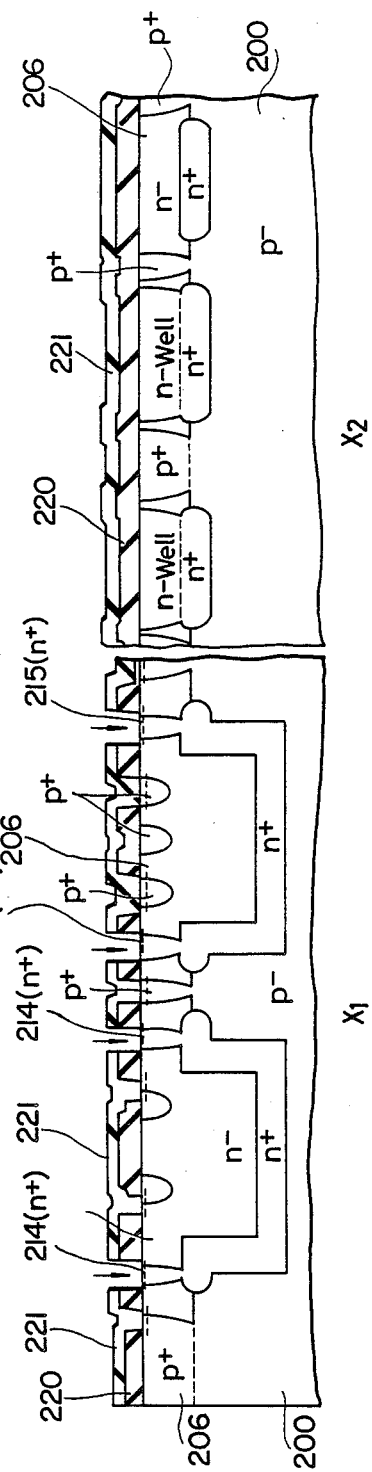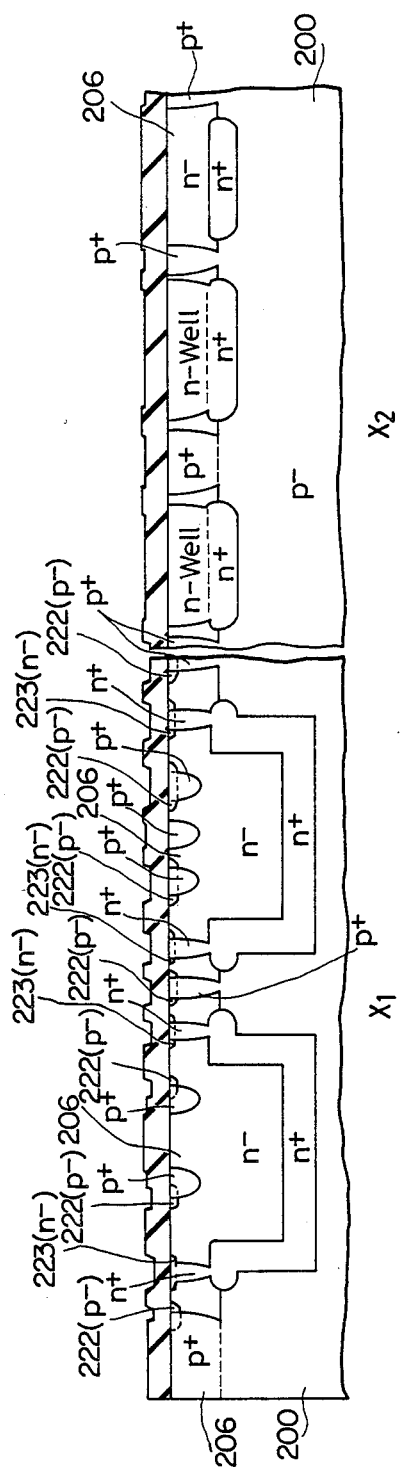

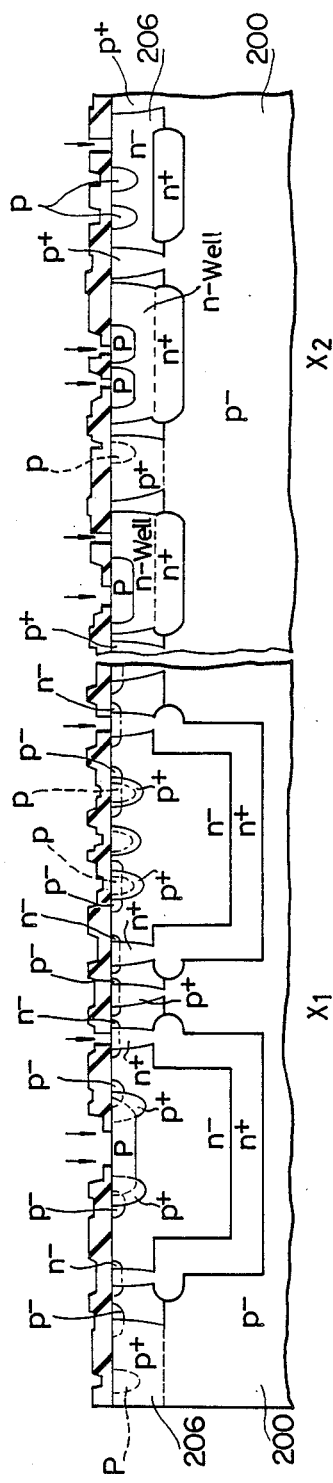
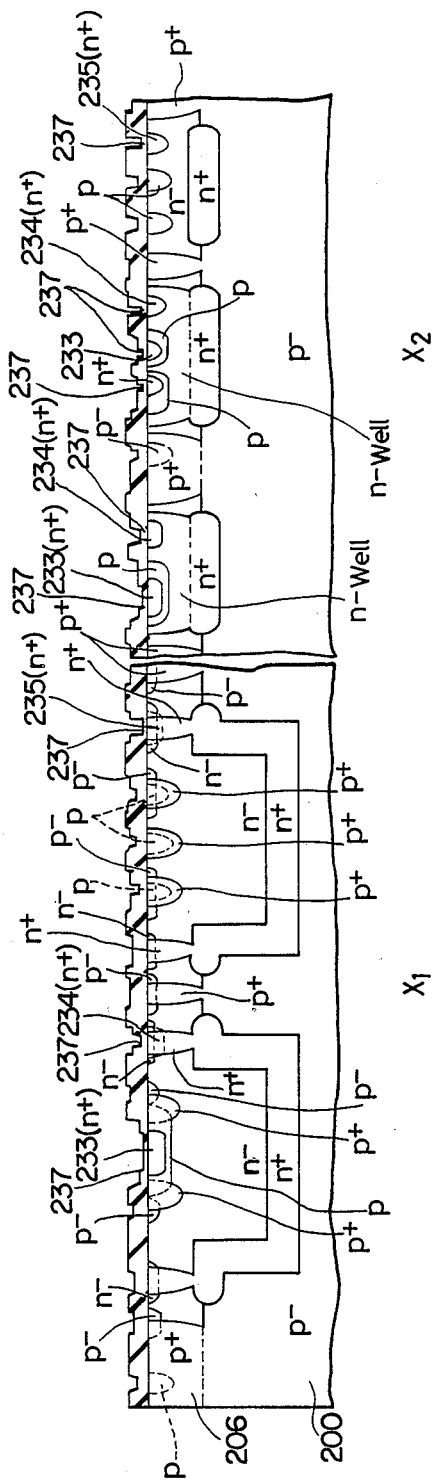
FIG. 41
FIG. 42

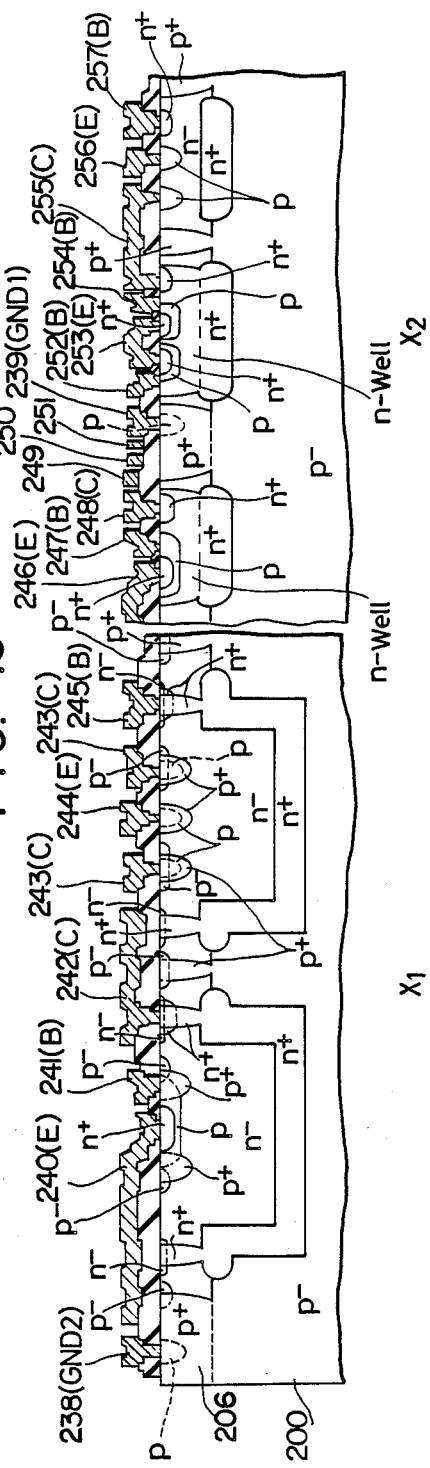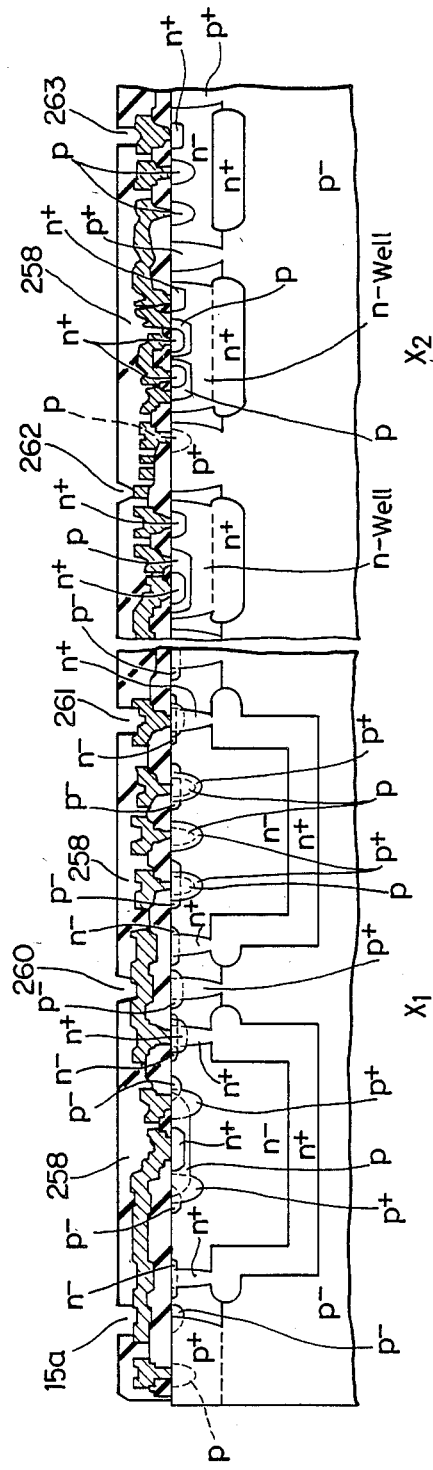

SEMICONDUCTOR INTEGRATED CIRCUIT DEVICE

This application is a continuation of application Ser. No. 039,118, filed on Apr. 16, 1987, now abandoned, which is a divisional of application Ser. No. 768,320, filed Aug. 22, 1985, now abandoned.

BACKGROUND OF THE INVENTION

The present invention relates to a semiconductor integrated circuit device and, more particularly, to a semiconductor integrated circuit device for driving a vacuum fluorescent display device (hereafter referred to as a "VFD"). The vacuum fluorescent display device is constructed basically of:

(1) an anode made of a fluorescent material;
(2) a cathode for emitting electrons; and
(3) a grid interposed between the anode and the cathode for controlling the migration of the electrons.

When the cathode is supplied with a specified voltage, it is heated to about 650° C. to emit the electrons. If a positive voltage is applied to both the (fluorescent) anode and the grid, the electrons emitted from the cathode pass over the grid and are accelerated to impinge upon the fluorescent material, whereupon this material emits light. The vacuum fluorescent display device, in which fluorescent dots are arrayed in a matrix shape, is called a "dot matrix vacuum fluorescent display device".

In recent years, he need has increased for producing graphic fluorescent display panels having extremely high display capacity and density. In view of this technical trend, we have investigated developments of dot matrix displays of capacity as high as 240 dots (vertically)×320 dots (horizontally) or fluorescent display tubes and have revealed the following functions required for the drive IC of a vacuum fluorescent display device:

(1) In order to achieve high luminosity of a fluorescent display tube, it is necessary to abruptly accelerate the electrons generated from the cathode and to make them impinge upon the fluorescent material at high speed. In order to attain high luminosity, a voltage as high as 250 V has to be applied to the anode and the grid. Therefore, the drive device (or the driver IC) for the anode and the grid must be able to withstand a considerably high voltage.

(2) In order to improve the display function of the fluorescent display tube of high capacity, moreover, it is necessary to scan (or drive) the fluorescent matrix at a high speed. For this reason, it is necessary to remarkably shorten the period from the time when data is input to the time when the drive output is generated. This makes it necessary to operate the anode and grid driver at high speed.

(3) In order to reduce heat dissipation of the driver IC, this IC has to be operated with low power consumption.

(4) In order to reduce the size of the vacuum fluorescent display device, the chip area of the driver IC has to be made small.

In order to satisfy the needs for the high luminoscity and capacity of the fluorescent display tube, as has been described above, the anode and grid driver are required to have a high voltage function, high speed, low power consumption and must be small. It is, however, very difficult to satisfy all those requirements. Therefore, it is difficult to integrate the driver.

These difficulties will be described in the following from the respective standpoints of the circuit, device and layout.

Circuit Problems (1) In order to speed up the driver IC, a high-speed logic circuit such as an ECL (i.e., emitter-coupled logic) had to be adopted in the past to construct a shift register to be used for data transfer. Unfortunately, a high-speed bipolar logic circuit such as an ECL has such a large power consumption that the aforementioned driver for driving the fluorescent large capacity matrix draws much current and dissipates much heat. An ECL also has a low degree of integration. Therefore, although the ECL arrangement has desirable speed characteristics, it is undesirable in terms of power consumption and size.

(2) Investigation is required to determine how the high voltage circuit at the output stage of the driver IC can be constructed so as to have fewer elements and a higher reliability.

Device Problems (1) In driver ICs, there have to be formed within a common semiconductor body both high voltage elements and low voltage elements required for high-speed operations to execute data transfer.

It is not easy to determine how either elements having breakdown voltages as high as 150 to 250 V or elements for high-speed operations as high as several tens of MHz can be constructed, especially within a common IC.

(2) It is necessary to select a process for efficiently fabricating the elements of the two different types, as specified in the problem (1), in the semiconductor body.

Layout Problems (1) It is necessary to investigate an element arrangement capable of preventing the high-speed logic circuit from being adversely affected by the high voltage of the high voltage circuit.

According to our investigations, for example, it has been made apparent that, if a high voltage main line as high as 150 to 250 V is arranged in the peripheral portion of a chip, electrolysis of water (which may enter into the IC, for example, at the chip periphery) occurs because of the potential of that line. Therefore, corrosion of the bonding pads is promoted by the effect of the ions formed.

It is also made apparent that polarization in the passivation film, such as the inter-layer insulating film, is caused by the potential of the high main line. Therefore, extension of a depletion layer, for example, is possibly restricted by the effect of the polarized ions to lower the breakdown voltage and/or a parasitic channel thereby to cause malfunctions in the logic circuit.

(2) It is necessary to investigate how high voltage elements having large areas and the small signal elements having small areas can both be arranged to reduce the size of the IC.

The present invention has been conceived so as solve the problems described hereinbefore.

SUMMARY OF THE INVENTION

Circuit Features (1) The data transfer register and the latch in the grid and anode driver are constructed of a complementary Schottky transistor logic (hereafter referred to as a "CSTL").

The CSTL is a two-input NOR type circuit in which two paired transistors can be formed in one island region so that the integration density is far higher than that of the ECL. On the other hand, the CSTL is an unsaturated circuit having an operating frequency as high as several tens of MHz to several hundred MHz. The CSTL structure is discussed, for example, in the article "Complementary Schottky Transistor Logic" by Kenji Kaneko et al, published in *The Transactions of the Institute of Electronics and Communication Engineers of Japan*, Vol. J65, No. 4, April 1982, pp. 215-221, which is herein incorporated by reference. The CSTL speeds up the small signal logic circuit and improves the integration of that circuit.

(2) Due to the so-called "stack construction" which is made by dividing the shift register into a plurality of groups, by connecting the divided groups of shift registers in series, and by feeding the operating current of the upper shift register group as that of the next shift register group, the main voltage is utilized to the best advantage to suppress power consumption at a low level.

(3) The output stage of the driver IC is a remarkably simple circuit composed of six elements, as shown in FIGS. 8 to 10.

Device Features (1) A region to be formed with the high voltage element has its breakdown voltage raised by thickening its epitaxial layer. In order to further improve the breakdown voltage of the high voltage element, on the other hand, the surface of an isolation layer, the surface of the base region of a high voltage NPN transistor, and the surface of the collector region of a high voltage PNP transistor are formed with lightly doped layers (or guard rings) having the same conduction types as those of the respective layers so that they may resist being formed with any inversion layers, thereby to facilitate extensions of the depletion layers, so as to enlarge the curvature of the depletion layers at the edges, thereby raising the breakdown voltage.

The device is so constructed that inversion layers are unlikely to be formed thereby preventing insufficient breakdown voltage and raising the breakdown voltage by forming the surface of the collector electrode lead-out layer of the high voltage NPN transistor and the surface of the base electrode lead-out layer of the high voltage PNP transistor with impurity-doped layers (i.e., guard rings) having the same conduction types as those of the layers and lower concentrations than those of the layers. In the regions to be formed with the low voltage element and the small signal element (including the CSTL element), the parasitic resistance obstructing the speed-up is reduced to speed up the respective elements by selectively increasing the concentration of the semiconductor layer for the collector region.

(2) The steps are simplified by sharing the aforementioned guard ring forming step.

Layout Features (1) A high speed logic circuit is arranged at the central portion of a chip and is surrounded by a high voltage driver including a high voltage element. Moreover, the ground line GND1 of the high speed logic circuit and the ground line GND2 of the high voltage driver are disposed separately from each other such that the high speed logic ground line GND1 is arranged to surround the high speed logic circuit formed at the center. A main line (or low-voltage main line) $V_{CC1}$ for the logic circuit is arranged to surround the aforementioned ground line GND1, and a high potential line (or a high main line) $V_{CC2}$ for the high voltage driver is arranged around the former main line $V_{CC1}$. By adopting the wiring arrangement described above, the potential gradient from the chip periphery formed with the high voltage driver to the chip center formed with the high speed logic is made gradual so that the effect of the potential of the high main line as high as 150 to 250 V may be prevented from being exerted upon the high-speed logic circuit.

Outside of (or around) the high main line $V_{CC2}$, moreover, there is arranged the ground line GND2 for the high voltage driver in a manner to surround the line $V_{CC2}$ so that the effect of the potential of the high main line may be prevented from being imparted to the chip periphery which is liable to be adversely affected by water.

(2) By applying the aforementioned method, moreover, high integration is contemplated by preventing dead space as much as possible from being formed in the adjacent portion between the high-speed logic circuit and the high voltage driver.

By the devices described above, it is possible to provide a high-performance driver IC which is extremely effective for realizing a large-capacity and high-speed vacuum fluorescent display device.

BRIEF DESCRIPTION OF THE DRAWINGS

FIG. 8 is a circuit diagram showing one example of the specific circuit construction of one of the high voltage drivers $A_1$ to $A_{32}$;

FIG. 9 is a circuit diagram showing another example of the specific circuit construction of one of the high voltage drivers $A_1$ to $A_{32}$;

FIGS. 20 to 46 are sectional views showing the essential portions of a process for fabricating the driver IC according to the present invention.

DESCRIPTION OF THE PREFERRED EMBODIMENTS

The present invention will be described in detail in the following with reference to the accompanying drawings. More specifically, the present invention will be described: in connection with its circuit features with reference to FIGS. 1 to 13; in connection with its layout features with reference to FIGS. 14 to 16; in connection with its device features with reference to FIGS. 17 to 19; and in connection with its fabrication process features with reference to FIGS. 20 to 46.

Embodiment 1

Description of the Circuit Features

This embodiment will be described with reference to FIGS. 1 to 13.

Figure 1:
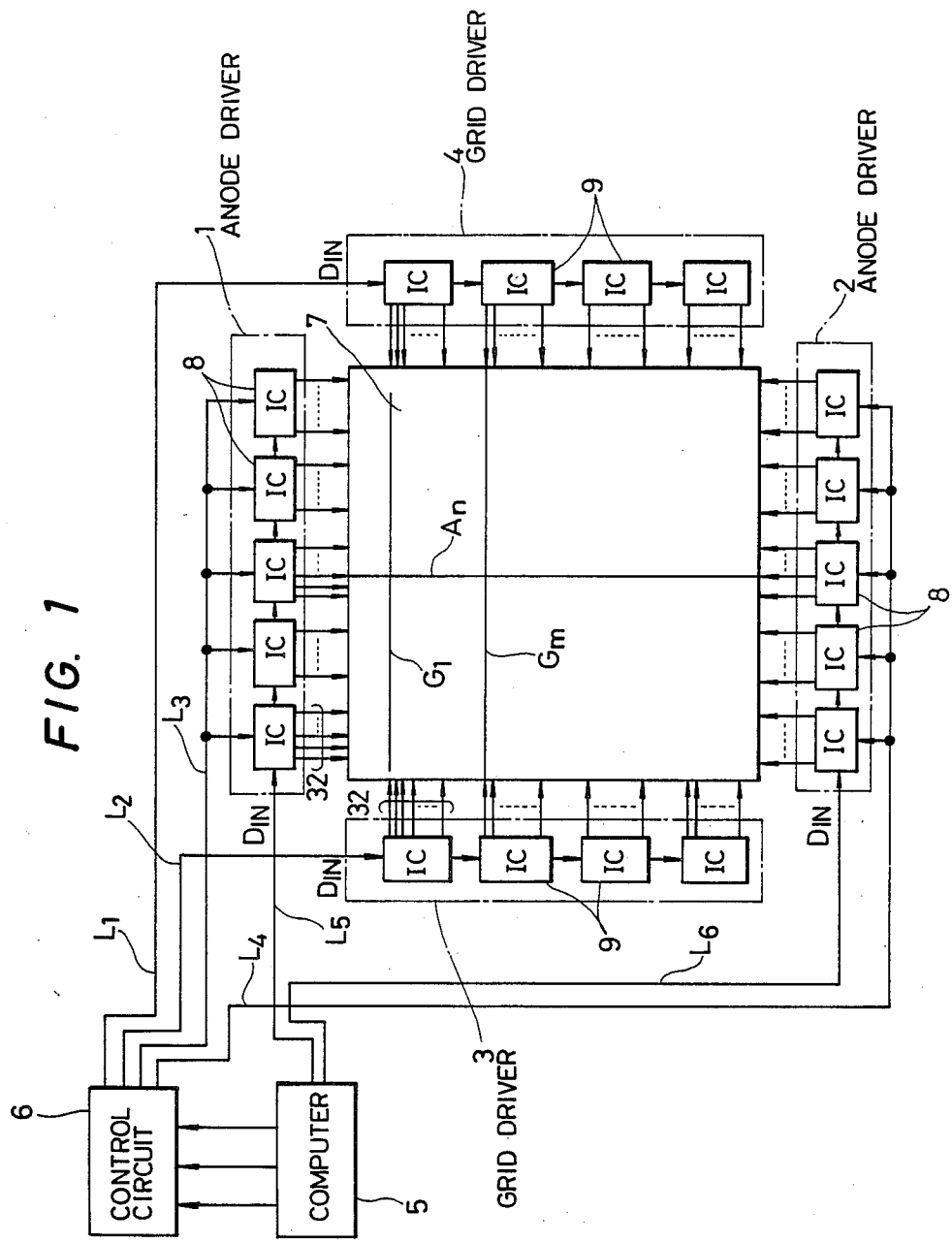
FIG. 1 is a block diagram showing the overall construction of the vacuum fluorescent display device according to the present invention.

FIG. 1 is a diagram showing the overall construction of the vacuum fluorescent display device according to the present invention. At the central portion, there is arranged a fluorescent dot matrix 7 which is made of 320×240 fluorescent dots and which is surrounded by anode drivers 1 and 2 and grid drivers 3 and 4. Commercially available fluorescent dot matrix devices suitable for this are manufactured by Hitachi, Ltd. under model numbers HA16721MP and HA16722MP. Also, discussion of a suitable fluorescent dot matrix for this can be found in the article "Vacuum Fluorescent Display Tube" by Kentaro Kiyozumi et al, published in *The Journal of the Institute of Electronics and Communication Engineers of Japan*, Vol. 65, No. 7, July 1982, pp. 713-719, which is herein incorporated by reference.

The anode drivers 1 and 2 and the grid drivers 3 and 4 are constructed, as is seen from FIG. 1, of anode driving ICs 8 and grid driving ICs 9, respectively. Each of the ICs is equipped with 32 drive output pins, for example, although the invention is not limited to that configuration, so that it can drive 32 grid or anode electrodes. Each IC is controlled by a computer 5 and a control circuit 6, for example, and input data $D_{IN}$ sent from the control circuit 6 is input through lines $L_1$ and $L_2$, respectively, to the grid drivers so that the grid drivers which drive grid electrodes $G_1$ to $G_{320}$ are repeatedly driven (or scanned) on the basis of the input data sequentially downward in the drawing, for example. The time period required for one scan from the uppermost to the lowermost grid electrode is 0.107 secs (1/60 second), for example.

To each anode electrode driving IC8, the input data $D_{IN}$ is transferred through lines $L_5$ and $L_6$ by a shift register (which will be described with reference to FIG. 2) in the IC. At the instant when the information is transferred to all the shift registers of the anode driving IC, latch signals are sent from the control circuit 6 through lines $L_3$ and $L_4$ so that the information in the shift registers is temporarily held by the latch. On the basis of this information, the high voltage drivers are activated to simultaneously drive the 320 grids with the parallel outputs. Thus, light is emitted from the (fluorescent) dots which are positioned at the intersections between anodes $A_n$ supplied with the positive voltage and grids $G_n$ supplied with the positive voltage.

Here, the light emitting operation of the fluorescent display tube will be briefly described. When the cathode is supplied with a specified voltage, it is heated to about 650° C. to emit electrons. The grid is interposed between the cathode and the anode to control the migration of the electrons emitted from the cathode. More specifically, the electrons from the cathode are uniformly accelerated and diffused into the anode, if a positive voltage is applied to the grid, but are blocked from migrating toward the anode if a negative voltage is applied to the same. Only when a positive voltage is applied to both the grid and the anode (or the fluorescent member), the electrons emitted from the cathode can reach the anode and can stimulate the fluorescent member to cause the same to emit light.

The vacuum fluorescent display device according to the present invention has been touched above in its entirety.

Figure 2:
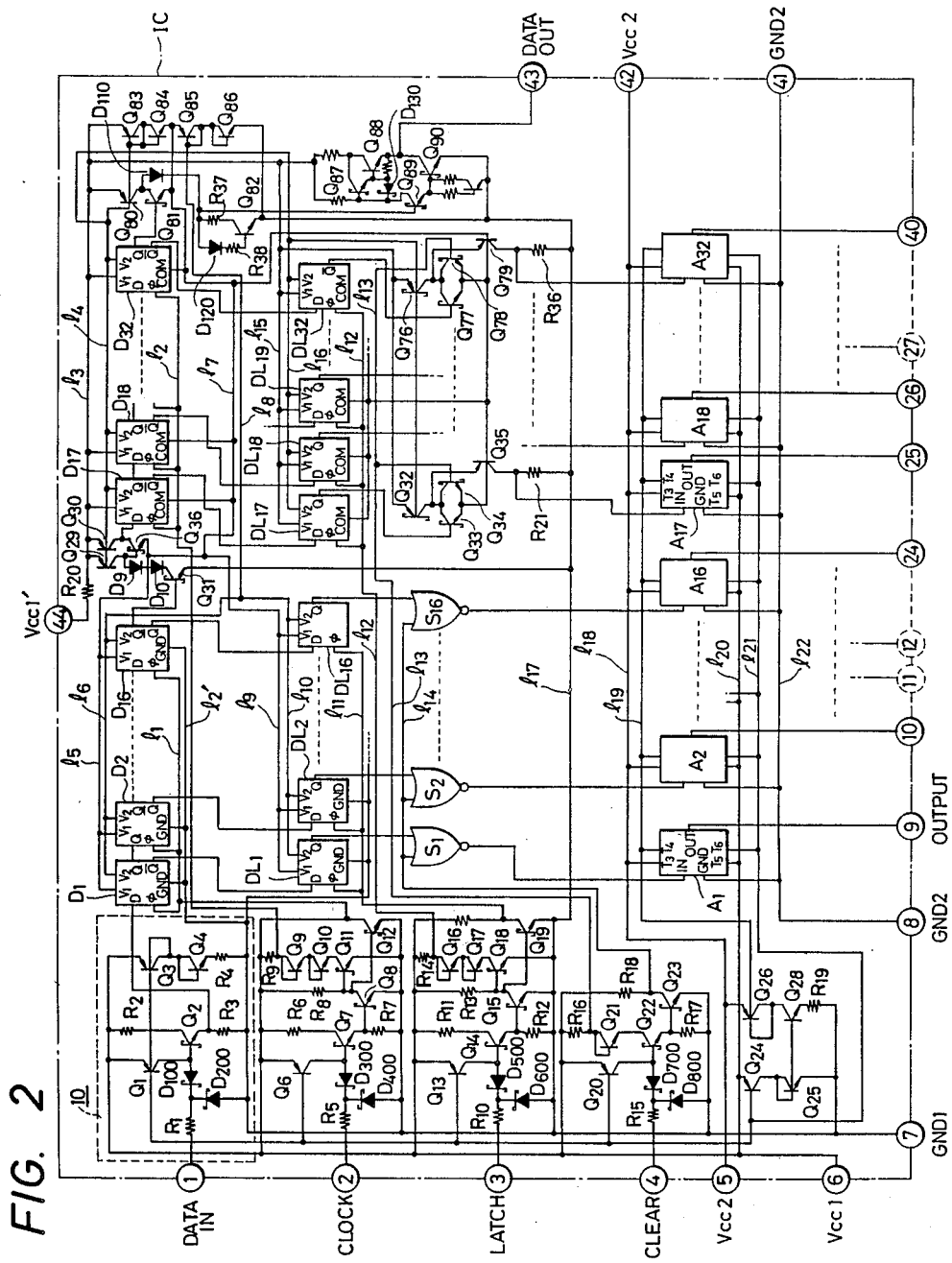
FIG. 2 is a circuit diagram showing the overall circuit construction of an anode (or grid) driver according to the present invention.

Next, a specific circuit construction of the anode driving ICs 8 (or the grid driving ICs 9) will be described in the following. FIG. 2 shows the overall circuit construction of the anode (or grid) driving ICs 8.

In the drawing, circles enclosing numerals indicate external connection terminals including; a data input terminal (DATA IN) to be connected with the lines $L_5$ and $L_6$ of FIG. 1; a clock input terminal (CLOCK) for inputting clock pulses for the shift registers; a latch signal input terminal (LATCH); main terminals ($V_{CC1}$, $V_{CC2}$ and GND); an output terminal (OUTPUT); and a data output terminal (DATA OUT). With the data input terminal, there is connected an input signal level changing circuit 10 which is composed of a diode $D_{100}$, transistors $Q_1$, $Q_2$, $Q_3$ and $Q_4$, and resistors $R_1$, $R_2$, $R_3$ and $R_4$ and which is operative to transform the input signal at the TTL (i.e., transistor-transistor logic) level into the operating level of the shift registers. The clock input terminal, the latch signal input terminal and the clear input terminal are also connected to level changing circuits which have circuit constructions similar to that of the level changing circuit 10. The output signal of the level shifting circuit 10 which serves as the shift register input is taken from the emitter of transistor $Q_2$. Another output signal taken from the collectors of transistors $Q_3$ and $Q_4$ is coupled to provide inputs to the terminals $T_6$ of the high voltage drivers $A_1$, $A_2$, ... $A_{32}$, as well as to bases of transistors $Q_1$, $Q_3$, $Q_6$, $Q_{13}$ and $Q_{20}$ of the level shift circuits to control the providing of the supply voltage $V_{CC1}$ to the level shift circuits. The threshold voltage $V_{th}$ of the level changing circuit 10, as seen from the data input terminal, is given by:

$$V_{th} = V_{BEQ121} + V_{BEQ2} - V_F \qquad (1)$$

In the equation (1): $V_{BEQ121}$ designates the base-emitter voltage of a transistor $Q_{121}$ constructing the shift register $D_1$ shown in FIG. 4; $V_{BEQ\,2}$ designates the base-emitter voltage of the transistor $Q_2$; and $V_F$ designates the forward voltage of a Schottky diode $D_{100}$.

Letters $D_1$ to $D_{32}$ appearing in FIG. 2 designate D-type flip-flops which are made of the CSTLs to construct high-speed registers for transferring at a high speed the data input from the data input terminal.

Letters $DL_1$ to $DL_{32}$ designate D-type flip-flops which are also made of CSTLs to construct latches for latching the $\overline{Q}$ outputs of the flip-flops $D_1$ to $D_{32}$ constructing the shift registers, in parallel and at the feed timing of the latch signals.

Letters $A_1$ to $A_2$ designate the anode (or grid) drivers, which are composed of high voltage elements adapted to be operated by the power supply $V_{CC2}$ of 250 V, for example, for driving the anodes (or grids) on the basis of the outputs of the latches.

As has been described above, each IC has its circuit divided roughly into a high-speed logic using the CSTL and a high voltage driver including high voltage elements adapted to be operated by the high voltage power supply ($V_{CC2}$) of 250 V, for example.

Figure 11:
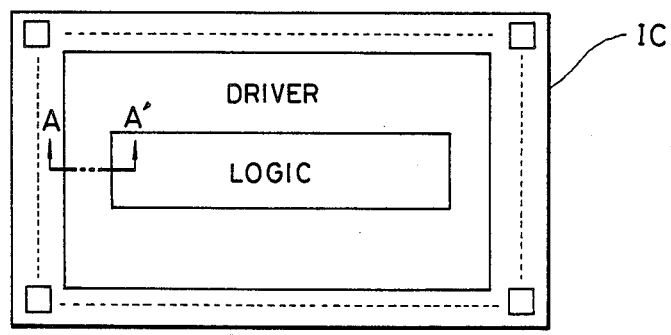
FIG. 11 is a top plan view showing the layout state of the anode (or grid) driver.

FIG. 11 schematically shows the top plan layout of the anode (or grid) driving IC. This IC is formed with a high speed logic (LOGIC) at the center of the chip and with a high voltage driver (DRIVER) at the peripheral portion of the chip. By arranging the higher power consumption driver on the peripheral portion of the chip, the heat generated in this driver is effectively dissipated by being radiated from the circumference of the chip, from the leads and so on.

Figure 12:
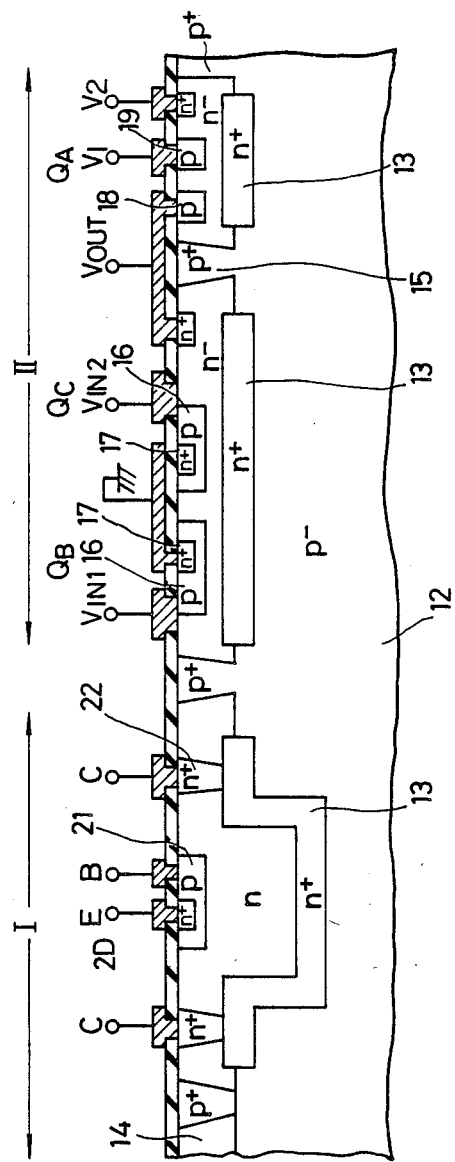
FIG. 12 is a section taken along line A—A' of FIG. 11.

FIG. 12 is a section taken along line A—A' of FIG. 11. In FIG. 12, a region I is a region to be formed with a high voltage element whereas a region II is a region to be formed with a logic element made of the CSTL.

This CSTL is devised, as follows, to maintain its high speed, as shown with its basic construction in FIG. 13:

(1) One or more forward operating NPN transistors (e.g. $Q_B$ and $Q_C$) are drive transistors (having emitters 17 coupled to ground, base regions 16 coupled, respectively, to receive inputs $V_{IN1}$ $V_{IN2}$ and a common collector formed by the n$^-$ island in which the transistors are formed, and the buried n$^+$ layer 13, with the common collector being coupled to provide an output $V_{OUT}$);

(2) A Schottky clamping structure is used so as to prevent the base-collector of the drive transistors $Q_B$ and $Q_C$ from being saturated (by extending the input metal electrodes for $V_{IN1}$ and $V_{IN2}$ to cover both the base regions 16 and the n$^-$ island of the collectors); and (3) A PNP transistor (e.g. $Q_A$) is used as a load and has its base supplied with a constant voltage $V_2$ so as to avoid saturation. This PNP transistor has collector 18 receiving $V_{OUT}$ from $Q_B$ and $Q_C$, and an emitter 19 receiving $V_1$. The voltages $V_1$ and $V_2$ are both derived from low voltage supply $V_{CC1}$ as shown in FIG. 2.

Figure 13:
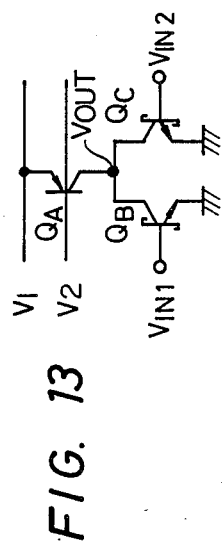
FIG. 13 is a circuit diagram showing a specific circuit construction of the complementary Schottky transistor logic.

In order to increase the integration density, the following devices are made, as in FIGS. 12 and 13:

(1) The circuit construction is of the NOR circuit type, in which the NPN transistors $Q_B$ and $Q_C$ have their collectors shared in one gate, to reduce the number of the element isolation regions; and (2) The load PNP transistor $Q_A$ is used as a constant-current load and has its base region made common for the loads of all the gates so that it may have only one element isolation region.

Due to the devices described above, the CSTL speed is at least ten times that of I$^2$L and can have its integration density improved drastically, as compared with that of the ECL.

In view of the high voltage element, it has been devised not only to enlarge the size of the transistor but also to adopt the so-called "semi-well structure", in which an epitaxial layer 14 of the region I to be formed with the high voltage element is made thicker than that of the remaining epitaxial region 14, as better seen from FIG. 12, so that the element can withstand a high voltage.

The driver of the vacuum fluorescent display device has been briefly described above in connection with its speed-up and its improvements in integration density and breakdown voltage.

Next, the technique of reducing the power consumption, which plays an important role in the present invention, will be described with reference to FIG. 2. As has been described hereinbefore, the CSTL has excellent characteristics such as high speed and integration density but consumes much power so that the heat generated interferes with integration of the driver of the vacuum fluorescent display device because the PNP transistor has to be turned on at all times so as to feed a constant current. We have solved the above-specified problem by stacking the shift registers and the latches. As shown in FIG. 2, more specifically, the shift register is divided into a lower shift register composed of the D-type flip-flops $D_1$ to $D_{16}$ and an upper shift register composed of the flip-flops $D_{17}$ to $D_{32}$, and the latch is divided into a group of lower latches composed of the D-type flip-flops $DL_1$ to $DL_{16}$ and a group of upper latches composed of the D-type flip-flops $DL_{17}$ to $DL_{32}$. The 44th terminal ($V_{CC1}'$) is supplied with a power of 5 V, which is supplied through lines $l_3$ and $l_{15}$ to the D-type flip-flops $D_{17}$ to $D_{32}$ composing the upper shift register and to the D-type flip-flops $DL_{17}$ to $DL_{32}$. The ground line $l_7$ of the D-type flip-flops $D_{17}$ to $D_{32}$ is connected with both the main line $l_5$ of the D-type flip-flops $D_1$ to $D_{16}$ composing the lower shift register and the main line $l_9$ of the grouped lower latch circuits so that the current having operated the D-type flip-flops $D_{17}$ to $D_{32}$ is used again as the operating current of the lower shift register and the grouped lower latches. As a result, the power consumption can be reduced by one half, as compared with the case other than the stack structure.

With this stack structure, on the other hand, the level of the Q outputs of the latches $DL_{17}$ to $DL_{32}$ is raised by $2V_{BE}$ (wherein $V_{BE}$ designates the base-emitter voltage of the transistor) so that the input signal levels of the high voltage drivers $A_1$ to $A_{32}$ become different. In order to prevent this level difference, each of the upper latches $DL_{17}$ to $DL_{32}$ is equipped with a level shifter which is composed of transistors $Q_{32}$, $Q_{33}$, $Q_{34}$ and $Q_{35}$, a resistor $R_{21}$ and so on. As shown in FIG. 2, the level shifter uses the CSTL and has a reduced number of elements to have a relatively simple circuit construction as a whole so that the increase in the chip size as a result of addition of the level shifter is minimized. In the following, the operations of the level shifter will be briefly described in connection with that for the latch $DL_{17}$ which is composed of the transistors $Q_{32}$, $Q_{33}$, $Q_{34}$ and $Q_{35}$, and resistor $R_{21}$.

This level shifter is composed of the constant-current load PNP transistor $Q_{32}$, the transistors $Q_{33}$ and $Q_{34}$ forming a differential couple, the transistor $Q_{35}$ having its base biased at a voltage level of $V_{CC1}'$ (5 V)$-2V_{BE}$, and the resistor $R_{21}$ for setting the input signal level of the high voltage driver $A_{17}$.

If the Q output of the latch $DL_{17}$ is at a high ("H") level, the transistor $Q_{33}$ is turned on, and the emitter potential of the transistor $Q_{35}$ takes a low ("L") level so that the transistor $Q_{35}$ is turned off. As a result, the signal at the low (or ground) level is input to the high voltage driver $A_{17}$. If the Q output of the latch $DL_{17}$ is at the low level, the transistor $Q_{33}$ is turned off whereas the transistor $Q_{35}$ is turned on, and a bias voltage is generated between the two terminals of the resistor $R_{21}$ as result of the voltage drop so that the signal at the high level is input to the high voltage driver $A_{17}$. The resistor $R_{21}$ has its resistance set such that the voltage drop caused in the resistor $R_{21}$ becomes equal to the high level of the output signal of NOR circuits $S_1$ to $S_{16}$. As a result, the input signals of the high voltage drivers $A_1$ to $A_{32}$ are regulated to the common level.

The NOR circuits $S_1$ to $S_{16}$ and so on are provided to effect clearance. This "clearance" means, in this instance, that all the fluorescent dot matrices of the vacuum fluorescent display device are brought into their non-light-emitting states. When the low level signal is inputted to the 4th terminal (CLEAR), lines $l_{13}$ and $l_{14}$ take the high level to fix the outputs of the NOR circuits $S_1$ to $S_{16}$ and so on at the high level. As a result, the outputs of the high voltage drivers $A_1$ to $A_{32}$ are fixed at the low level to clear the image. The stack structure and the clearing operations of the shift registers and the latches have been described hereinbefore.

Next, the specific circuit constructions and operations of the D-type flip-flops $D_1$ to $D_{32}$ composing the shift register and the D-type flip-flops $DL_1$ to $DL_{32}$ composing the latch will be described in the following with reference to FIGS. 3 to 7.

Figure 3:
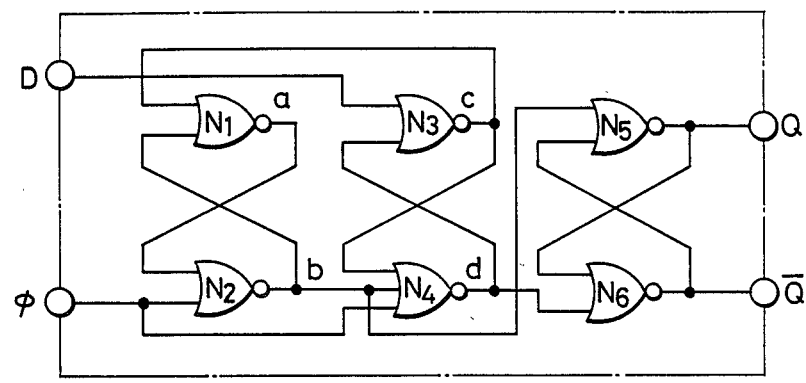
FIG. 3 is a circuit diagram showing the circuit construction of one of the D-type flip-flop circuits $D_1$ to $D_{32}$, which make a shift register, by means of logic symbols.
Figure 4:
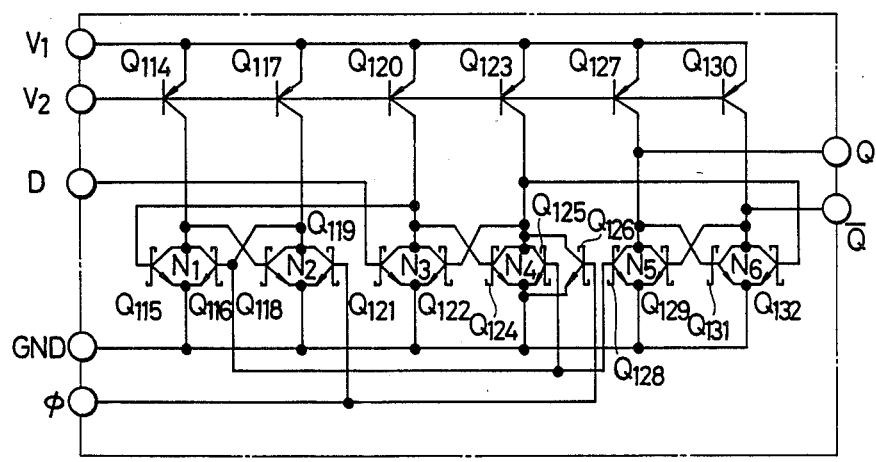
FIG. 4 is a circuit diagram showing a more specific circuit construction of the D-type flip-flop circuit $D_1$ to $D_{32}$ shown in FIG. 3.

FIG. 3 is a circuit diagram showing the circuit construction of the D-type flip-flops $D_1$ to $D_{32}$ composing the shift register, by means of the logic symbols, and FIG. 4 is a circuit diagram showing the more specific circuit construction of the flip-flops $D_1$ to $D_{32}$. As shown in FIGS. 3 and 4, this circuit is constructed of six NOR circuits $N_1$ to $N_6$, each of which is made of the CSTL composed of transistors $Q_{114}$ to $Q_{132}$.

The truth table of this circuit is:

TABLE 1

| φ | D | a | b | c | d | $Q_n$ | $\overline{Q_n}$ |
|---|---|---|---|---|---|---|---|
| 1 | 0 | 0 | 0 | 1 | 0 | $Q_{n-1}$ | $\overline{Q_{n-1}}$ |
|  | 0 | 0 | 1 | 1 | 0 | 0 | 1 |
| ↘0 |  |  |  |  |  |  |  |
| 0 | 1 | 0 | 1 | 0 | 0 | $Q_{n-1}$ | $\overline{Q_{n-1}}$ |
|  | 1 | 1 | 0 | 0 | 0 | $Q_{n-1}$ | $\overline{Q_{n-1}}$ |
| ↗1 |  |  |  |  |  |  |  |
| 1 | 1 | 1 | 0 | 0 | 0 | $Q_{n-1}$ | $\overline{Q_{n-1}}$ |
|  | 1 | 1 | 0 | 0 | 1 | 1 | 0 |
| ↘0 |  |  |  |  |  |  |  |
| 0 | 0 | 1 | 0 | 0 | 1 | $Q_{n-1}$ | $\overline{Q_{n-1}}$ |

TABLE 1-continued

| φ | D | a | b | c | d | $Q_n$ | $\overline{Q_n}$ |
|---|---|---|---|---|---|---|---|
|  | 0 | 0 | 0 | 1 | 0 | $Q_{n-1}$ | $\overline{Q_{n-1}}$ |
| ↗1 |  |  |  |  |  |  |  |

In the Table 1, $Q_{n-1}$ and $\overline{Q}_{n-1}$ designate that the previous states are held. a, b, c and d designate the respective nodes shown in FIG. 3. From Table 1, it can be seen that the D-type flip-flop samples the data (D) in response to the falling (i.e., negative) edge of the clock signal $\phi$.

Next, specific circuit construction and operation of the D-type flip-flops $DL_1$ to $DL_{32}$ constructing the latch will be described in the following.

Figure 5:
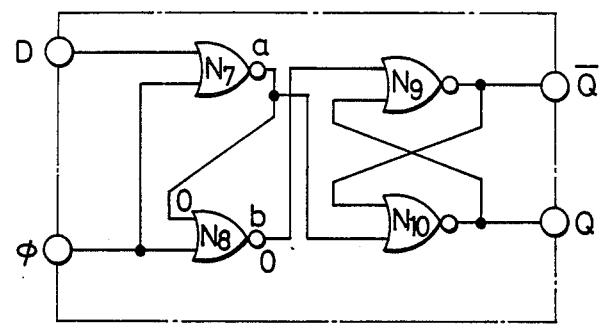
FIG. 5 is a circuit diagram showing the circuit construction of one of the D-type flip-flop circuits $DL_1$ to $DL_{32}$, which form a latch, by means of logic symbols.
Figure 6:
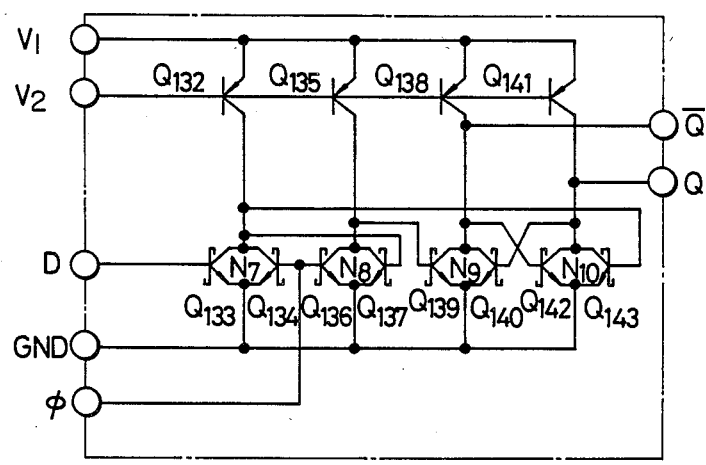
FIG. 6 is a circuit diagram showing a more specific circuit construction of the D-type flip-flop circuit $DL_1$ to $DL_{32}$ shown in FIG. 5.

FIG. 5 is a circuit diagram showing the circuit construction of the D-type flip-flops $DL_1$ to $DL_{32}$ by means of logic symbols, and FIG. 6 is a circuit diagram showing a more specific circuit construction of the flip-flops $DL_1$ to $DL_{32}$. As shown in FIGS. 5 and 6, this flip-flop is constructed of four NOR circuits $N_7$ to $N_{10}$, which circuits are composed of transistors $Q_{132}$ to $Q_{143}$.

The truth table for this is:

TABLE 2

| φ | D | a | b | $Q_n$ |
|---|---|---|---|---|
| 1 | 0 | 0 | 0 | $Q_{n-1}$ |
|  | 0 | 1 | 0 | 0 |
| ↘0 |  |  |  |  |
| 1 | 1 | 0 | 0 | $Q_{n-1}$ |
|  | 1 | 0 | 1 | 1 |
| ↘0 |  |  |  |  |
| 0 | 0 | 1 | 0 | 0 |

In Table 2, a and b designate the respective nodes of FIG. 5. As can be seen from Table 2, this D-type flip-flop is not of the edge trigger type such as the flip-flops $D_1$ to $D_{32}$ constructing the shift register but of the so-called "through latch type", in which the data which is input will in turn be output when the clock signal ($\phi$) is at the low ("0") level.

Figure 7:
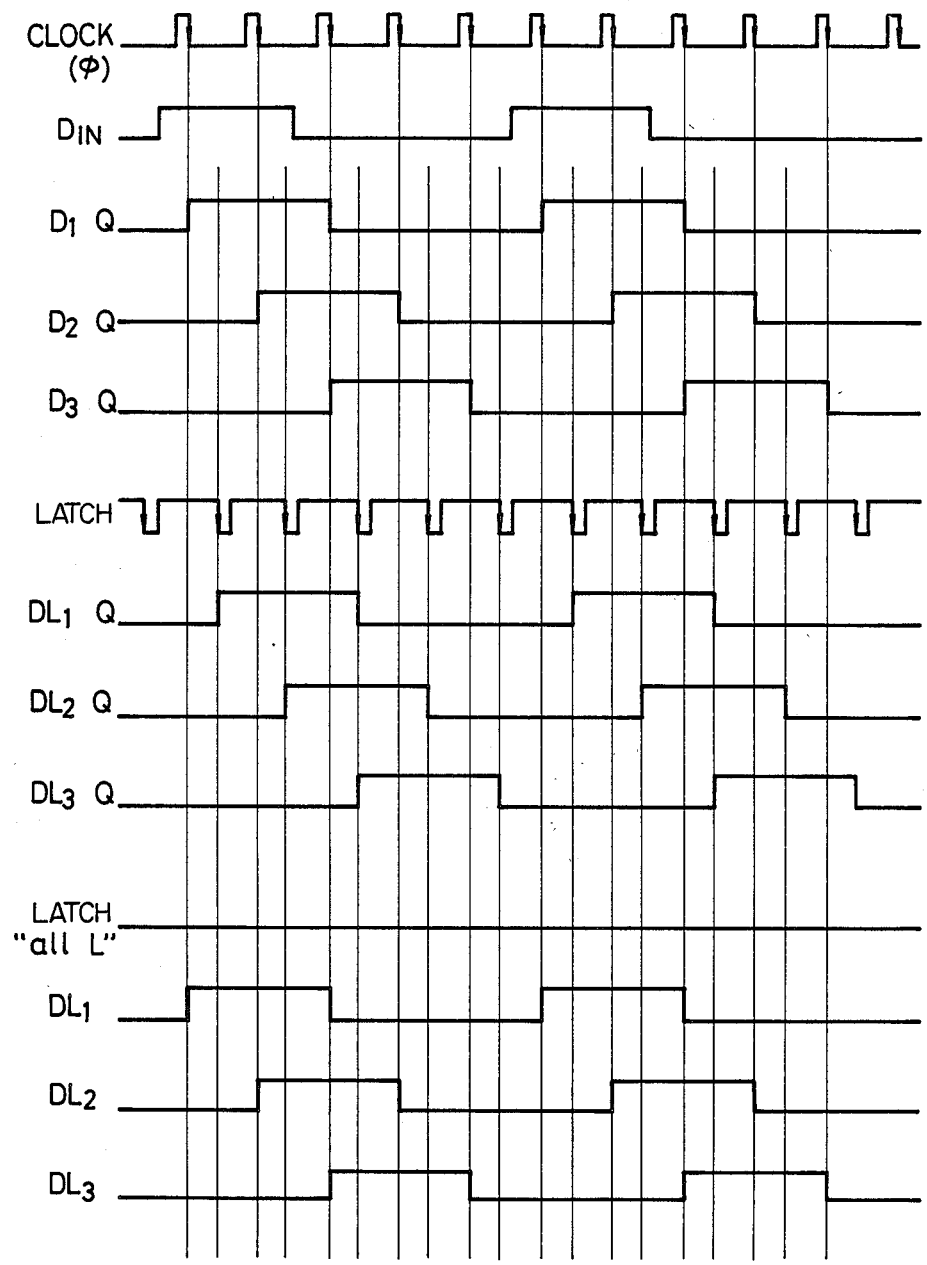
FIG. 7 is a timing chart for describing the circuit operations of the shift register and the latch constructed, respectively, of a plurality of the elements shown in FIGS. 5 and 6.

Next, the output waveforms of the shift register and the latch will be described with reference to FIG. 7. If the data ($D_{IN}$) shown in FIG. 7 is input, the Q outputs $D_1Q$, $D_2Q$ and $D_3Q$ of the D-type flip-flops constructing the shift register, appear consecutively with a delay of a predetermined period.

A latch signal (LATCH) is input with a phase shift of about 90 degrees from the phase of the clock signal ($\phi$) to the flip-flops $DL_1$ to $DL_{32}$. Since the flip-flops $DL_1$ to $DL_{32}$ are such through latches as output the Q outputs of the flip-flops $D_1$ to $D_{32}$ when the latch signal takes the value "0", the outputs $DL1_Q$, $DL2_Q$ and $DL3_Q$ of the flip-flops $DL_1$ to $DL_{32}$ take such waveforms as are shown in FIG. 7. The merits of this through latch type reside in the following points.

In the anode driving IC, more specifically, the input data is subjected to a series-parallel transformation, and the latch is therefore indispensable. In the grid driving IC, however, the latch can be dispensed with because the grids may be driven consecutively downward in FIG. 1, as has been described with reference to FIG. 1. The latch, however, has the disadvantage that the driving speed of the grid is delayed as a result of the signal delay at that latch. In the present embodiment, however, the input data $D_{IN}$ appears as it is at the outputs of the flip-flops $DL_1$ to $DL_{32}$, if the latch signal (LATCH) is fixed at the low level ("L"), so that no signal delay arises in the latch. Thus, a pulsating signal is applied, as shown to FIG. 7, to the latch signal input terminal 3 (LATCH) when the IC shown in FIG. 2 is used for the anode driving operation, and the latch signal to be applied to the latch signal input terminal 3 is always fixed at the low level when that IC is used for the grid driving operation. Thus, the IC an be very advantageously utilized under optimal conditions.

The specific circuit constructions and operations of the D-type flip-flops $D_1$ to $D_2$ constructing the shift register and the D-type flip-flops $DL_1$ and $DL_2$ constructing the latch have been described hereinbefore.

Next, the specific circuit constructions of the high voltage drivers $A_1$ to $A_{32}$ will be described in the following with reference to FIGS. 8 to 10.

FIG. 8 shows one example of the specific circuit constructions of the high voltage drivers $A_1$ to $A_{32}$ of FIG. 2. As shown in FIG. 8, each high voltage driver is composed of transistors $Q_{101}$ to $Q_{106}$, of which the transistors $Q_{101}$, $Q_{102}$, $Q_{103}$ and $Q_{106}$ are high voltage transistors. The outputs of the NOR circuits $S_1$ to $S_{16}$ of FIG. 2 serve as the input signals to the $T_1$ terminals of drivers $A_1$ to $A_{16}$. On the other hand, the outputs of the level shift circuits ($Q_{32}$, etc.) serve as input 20 signals to the $T_1$ terminals of drivers $A_{17}$ to $A_{32}$.

The transistor $Q_{105}$ is a switching transistor having its emitter grounded and is turned on whereas the transistor $Q_{106}$ is turned off, if the input signal is at the high ("H") level, so that the collector of the transistor $Q_{106}$ takes the high level. Transistor $Q_{104}$ is controlled by an output signal from the transistors $Q_3$ and $Q_4$ of the level shift circuit 10 (see FIG. 2) applied to terminal $T_6$ for providing a current $I_1$ for operating $Q_{105}$ and $Q_{106}$. Then, the transistor $Q_{103}$ is turned off whereas the transistor $Q_{102}$ is turned on, and a constant current $I_0$ is amplified by the transistor $Q_{102}$ so that the following output current $I_{OUT1}$ is fed out:

$$I_{OUT1} = I_0 \times h_{FEQ102} \qquad (1).$$

As a result, a capacitive load $C_1$ (corresponding to the grid or anode) is charged up.

If the input is reduced to the low level, the transistor $Q_{105}$ is turned off whereas $Q_{106}$ is turned on so that the collector of the transistor $Q_{106}$ takes the low level. Then, the charge stored in the base of the transistor $Q_{102}$ is abruptly released through the collector-emitter of the transistor $Q_{106}$ so that the transistor $Q_{102}$ is turned off. The charge stored in the capacitive load $C_1$ is released through the base-emitter of the transistor $Q_{103}$ so that the following output current $I_{OUT2}$ flows:

$$I_{OUT2} = I_1 \times h_{FEQ106} \qquad (2).$$

The line $l_{18}$ is a high-voltage main line as high as 250 V, for example, (whereas the line $l_{20}$ is a main line for 5V), and the high voltage transistor is large together with the isolation layer (not shown), which suggests that the chip is large. Despite this, however, the circuit shown in FIG. 8 is composed of only six elements and is of simple construction so that the size of the chip can be held to a minimum.

FIG. 9 shows another example of a high voltage driver. If the input is at the high level, a transistor $Q_{113}$ is turned off whereas a transistor $Q_{112}$ is turned on.

Then, transistors $Q_{108}$ and $Q_{109}$ are turned on to send out the following output current:

$$I_{OUT1}' = I_0' \times h_{FEQ108} \times h_{FEQ109} \qquad (3).$$

Conversely, if the input is at the low level, the transistor $Q_{113}$ is turned on whereas the transistor $Q_{112}$ is turned off together with a transistor $Q_{110}$. Then, the charge stored in the base of the transistor $Q_{108}$ is released through the collector-emitter of the transistor $Q_{112}$ whereas the charge stored in the base of the transistor $Q_{109}$ is released through the emitter-base of the transistor $Q_{110}$ so that the transistors $Q_{108}$ and $Q_{108}$ are abruptly turned off.

After the transistors $Q_{108}$ and $Q_{108}$ are turned off, the charge stored in the capacitive load $C_1$ is released through the collector-base of the transistor $Q_{110}$ so that the following output current $I_{OUT2}'$ flows:

$$I_{OUT1}' = I_1' \times h_{FEQ112} \qquad (4).$$

When the transistors $Q_{108}$ and $Q_{109}$ are turned off, the leakage current flowing through the base-emitter of the transistor $Q_{108}$ is released to the ground through the emitter-base of the transistor $Q_{110}$ (and through the collector-emitter of the transistor $Q_{112}$) thereby preventing a malfunction which would occur if the transistor $Q_{109}$ were turned on by the leakage current. Since the transistors $Q_{112}$ and $Q_{113}$ have their emitters connected commonly, the emitter potentials of the transistors $Q_{112}$ and $Q_{113}$ are changed at a common level, even if the ground level (i.e., the potential level of a line $l_{22}$) is raised by the large current flowing when the high voltage transistor is turned on, so that the transistors $Q_{112}$ and $Q_{113}$ are unlikely to malfunction when they are switched.

Figure 10:
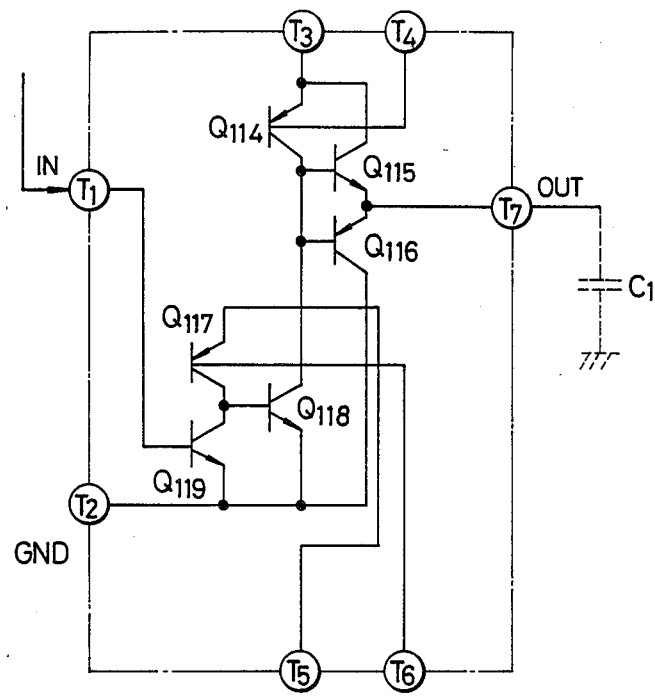
FIG. 10 is a circuit diagram showing still another example of the specific circuit construction of one of the high voltage drivers $A_1$ to $A_{32}$.

FIG. 10 shows still another example of the high voltage driver. This embodiment is characterized in that the output circuit has the push-pull construction using the transistors $Q_{115}$ and $Q_{116}$. Transistors $Q_{119}$ and $Q_{118}$ operate in a complementary fashion similar to $Q_{105}$ and $Q_{106}$ of FIG. 8 for respectively charging and discharging the capacitive load $C_1$ depending on the input at $T_1$.

The specific circuit construction and operation of the high voltage driver have been described hereinbefore.

The major portions of the vacuum fluorescent display device and the grid and anode drivers have been described hereinbefore, but a variety of additional devices have also been included in the aforementioned grid and anode drivers. For example, as shown in FIG. 2, the ground GND1 of the logic circuit (i.e., the small signal processing unit) and the ground GND2 of the high voltage drivers $A_1$ to $A_{32}$ are formed separately and discretely (In other words, 7th and 8th terminals are provided).

As a result, ground potential is raised by the large current flowing when the high voltage transistor is turned on and by the voltage drop caused by the line impedance of the ground line so that the logic can be prevented from any malfunction by the influences of the rise of the ground level.

As has been described hereinbefore, according to the present invention, it is possible that such anode and grid drivers (on one chip) have characteristics such as high withstand voltage, high speed or low power consumption. This makes it possible to provide a small vacuum fluorescent display device which has high capacity and luminosity.

(1) The speed and integration of the logic can be increased by constructing the shift registers and latches of the grid and anode drivers by means of the CSTL.

(2) Power consumption can be reduced by making the so-called "stack structure" in which the operating current of the upper shift register group is fed as the operating current of the lower shift register group by dividing the shift register into the plural shift register groups and by applying such a potential to each of the shift register groups as is incrementally reduced from the higher to the lower.

(3) It is possible to prevent any increase in the chip area by simplifying the circuit construction of the high voltage driver.

(4) The anode and grid driver can be integrated (into one chip) by effects (1) to (3) above. (5) Due to (1) to (4) above, it is possible to provide a vacuum fluorescent display device which has high capacity and luminosity and small size.

Embodiment 2

Description of Layout and Device Features

Figure 14:
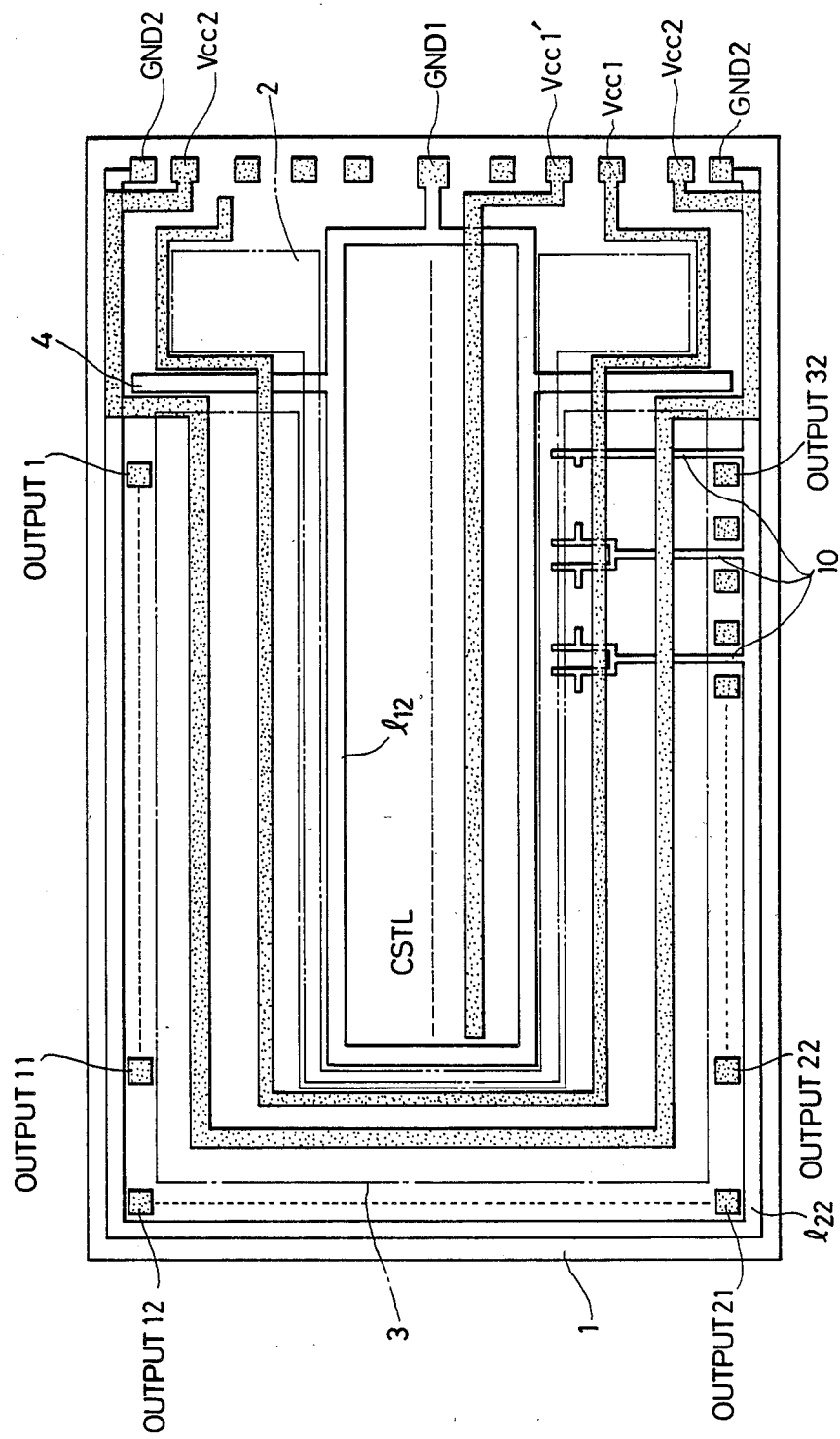
FIG. 14 is a top plan view showing a semiconductor integrated circuit driver device according to the present invention.

FIG. 14 is a top plan view showing the layout of the anode (or grid) driving IC.

As shown in FIG. 14, the CSTL comprising the high speed logic is arranged in the vicinity of the center of a chip 1, and a low voltage element is so arranged in a region 2 enclosed by double-dotted lines that it surrounds that CSTL. Moreover, a high voltage element is so formed on the periphery of the chip, e.g., in a region 3 enclosed by single-dotted lines that it surrounds the low voltage element forming region. The low voltage element region 2 is formed with the low voltage transistors, such as $Q_1$, $Q_2$, and so on of those which construct the level changer such as the circuit 10 for changing the level of an input signal and the low voltage transistors $Q_{104}$, $Q_{105}$, and so on of the high voltage drivers $A_1$, $A_2$, ..., and $A_{32}$. The high voltage element forming region 3 is formed with the high voltage transistors $Q_{101}$, $Q_{102}$, $Q_{103}$ and $Q_{106}$, for example, of the high voltage drivers $A_1$, $A_2$, ..., and $A_{32}$.

The reason why the elements are arranged in the above-described manner will be described in the following. Although the CSTL or the speeded-up logic has such a small element size that it can be highly integrated, the element having a high voltage with standing function is so large that it cannot be highly integrated, as will be described hereinafter. Therefore, a higher degree of freedom of the layout of the high voltage element would be attained if a fine element were formed in a small region at the center of the chip and if a larger element were formed in the wider region surrounding the chip center. Moreover, the CSTL has such a stack construction as is shown in FIG. 2, although it is always operating, and has its power consumption suppressed to a low level so that it generates less heat. Conversely, the high voltage driver containing the high voltage element generates more heat although it is not operating at all times. In short, the element which generates the most heat is arranged in the periphery of the chip so that the heat effect may be better dissipated.

Next, the wiring connection will be described in the following. It is notable in FIGS. 2 and 14 that the high-speed logic ground line GND1 and the high voltage driver ground line GND2 are provided separately. In particular, as shown in FIG. 14, the logic circuit ground line GND1 is arranged to surround the high speed logic CSTL formed at the center. The high voltage driver ground line GND2 is arranged on the periphery of the chip.

The high speed logic ground line GND1 is a line $l_{17}$ shown in FIG. 2 whereas the high voltage driver ground line GND2 is a line $l_{22}$ shown in FIG. 2.

Since the logic ground line GND1 and the high voltage driver ground line GND2 are provided separately in that way, the logic can be isolated from the effect of the current flowing through the high voltage driver ground line so that its reliability can be enhanced.

Moreover, the high speed logic CSTL is electrically isolated from the high speed ground line GND1 so that it can be less affected by the high voltage portion. The high speed logic ground line GND1 has a branch 4 between a portion of the low voltage element forming region and the high voltage element forming region thereby to eliminate the electrical effect between the two regions.

The main line for the power supply is divided into logic circuit main lines $V_{CC1}$ and $V_{CC1}'$ and a high potential line $V_{CC2}$ for the high voltage driver. The line $V_{CC1}$ is a main line of the input buffer 10 or the like in FIG. 3 whereas the line $V_{CC1}'$ is a main line for the CSTL constructing the shift register or the latch. The logic circuit main line $V_{CC1}$ is arranged to surround the high speed logic ground line GND1 and the low voltage element forming region 2, and the high potential line $V_{CC2}$ for the high voltage driver is arranged outside the main line $V_{CC1}$.

The lines $l_3$ and $l_{15}$ shown in FIG. 2 are the main lines for logic and are fed with the power from the line $V_{CC1}'$. The line $l_{18}$ expresses the high potential line $V_{CC2}$ for the high voltage driver.

By taking the aforementioned arrangements of the main and ground lines, the electrical effect of the high potential line $V_{CC2}$ for the high voltage driver to be supplied with a potential as high as 150 to 250 V can be prevented from being imparted to the low voltage elements and the high speed logic CSTLs. In view of the potential gradient (or inclination) of the curve in the direction from region 3 on the peripheral edge of the chip to be formed with the high voltage element to the center of the chip to be formed with the high speed logic CSTL, more specifically, a potential as high as 150 to 250 V is reduced to 5 V on the logic main line $V_{CC1}$ until it takes the ground potential at the high speed logic ground line GND1. As a result, the high speed logic is freed from the electrical effect of the high potential line $V_{CC2}$ (as high as 150 to 250 V) so that it can be made highly reliable while being freed from any malfunction.

Moreover, the ground line GND2 for the high voltage driver is arranged outside of the high main line $V_{CC2}$ to prevent the adverse affect of water seepage or the like. As shown in FIG. 14, more specifically, the high main line $V_{CC2}$ is formed inside, as far away from the chip periphery as possibly whereas the ground line GND2 for the high voltage driver is formed on the chip periphery. The output terminals OUTPUTs 1, ..., and 32 from the high voltage drivers $A_1$, $A_2$, ..., and $A_{32}$ are formed as close to the driver ground lines GND2 as possible so that they may be kept away from the high potential. Thanks to the arrangement described above, the output terminals OUTPUTs 1, ..., and 32 can be prevented from being ionized by surge current, even if water enters from the chip periphery, and accordingly from being corroded.

The ground line GND2 for the high voltage driver is equipped with two terminals, as shown, so that its apparent resistance is suppressed to a low level. Moreover, the high potential line $V_{CC2}$ is also equipped with two terminals. Ideally, it is desirable that the terminal of the high potential line $V_{CC2}$ be taken not from the terminal (which is located at the righthand side of the chip, as shown) of the ground line GND2 for the high voltage driver but from the lefthand side of the chip so that the relative potentials to be applied to the high voltage drivers $A_1, \ldots,$ and $A_{32}$ may be made equal. The present embodiment makes the aforementioned arrangement because the terminal positions are determined from the mounting requirement.

The fabrication of the main lines ($V_{CC1}$, $V_{CC2}$, GND1 and GND2) is characterized in that the ground lines (GND1 and GND2) are formed as first layer lines whereas the power supply lines ($V_{CC1}$ and $V_{CC2}$) are formed as second layer lines having a high degree of wiring freedom thereby to shorten the wiring length. The power supplies to the respective high voltage drivers are conducted through the through holes which are formed in the inter-layer insulating film, as will be described hereinafter.

Next, the novel layout of the respective high voltage drivers for the anode (or grid) driving ICs will be described with reference to FIGS. 15 and 16.

Figure 15:
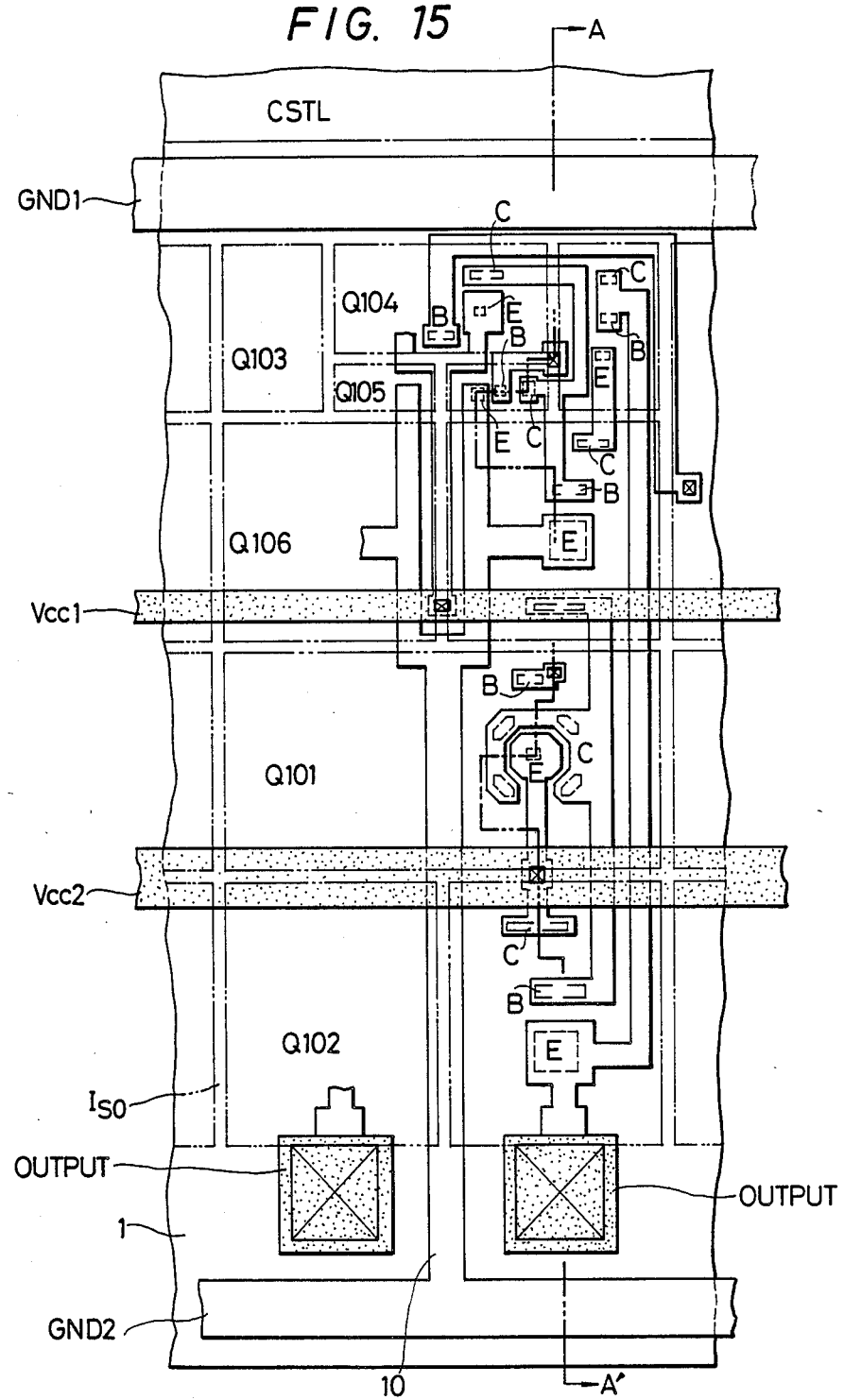
FIG. 15 is a top plan view showing in more detail one of the high voltage anode drivers according to the present invention.

FIG. 15 shows one of the layouts of the high voltage drivers $A_1$ to $A_{32}$ of the anode driving IC and the wiring thereof. However, the diffusion pattern of each transistor is not shown, because it will be described hereinafter. Moreover, the reference symbols $Q_{101}$ to $Q_{106}$ designate the arrangement relationships among the respective transistors in a relative manner. The high voltage driver for the anode driving IC is so constructed as is shown in FIG. 8 and is composed of the high voltage transistors $Q_{101}$, $Q_{102}$, $Q_{103}$ and $Q_{106}$ and the low voltage transistors $Q_{104}$ and $Q_{105}$ for driving the former transistors in response to an input signal IN.

As shown in FIG. 15, the high voltage transistors $Q_{102}$, $Q_{101}$ and $Q_{106}$ are arranged consecutively from the chip end (i.e., from the side of the driver ground line GND2), and the high voltage transistor $Q_{103}$ and the low voltage transistors $Q_{104}$ and $Q_{105}$ are efficiently arranged at the chip center (i.e., at the side of the logic ground line GND1) and without any increase in the area.

Thus, by arranging the low voltage transistors inside of the high voltage transistors, it is possible to eliminate dead space and to minimize the chip area.

In the drawing: reference letters B, C and E designate the respective base, collector and emitter electrodes of the transistors, respectively; broken lines indicate contact holes; X designates the contact portions between the first and second layer lines; and single-dotted lines indicate isolation ($I_{SO}$) regions for electrically isolating the respective transistors.

Moreover, adjacent high voltage drivers are so arranged axially symmetrically that two high voltage drivers can be laid out as one unit in the chip so as to shorten design time and to make a portion of the lines common. As shown in FIGS. 14 and 15, for example, the corresponding line is the ground line 10 which is branched from the driver ground line GND2. With this wiring, the impedance among the blocks can be made equal.

Figure 16:
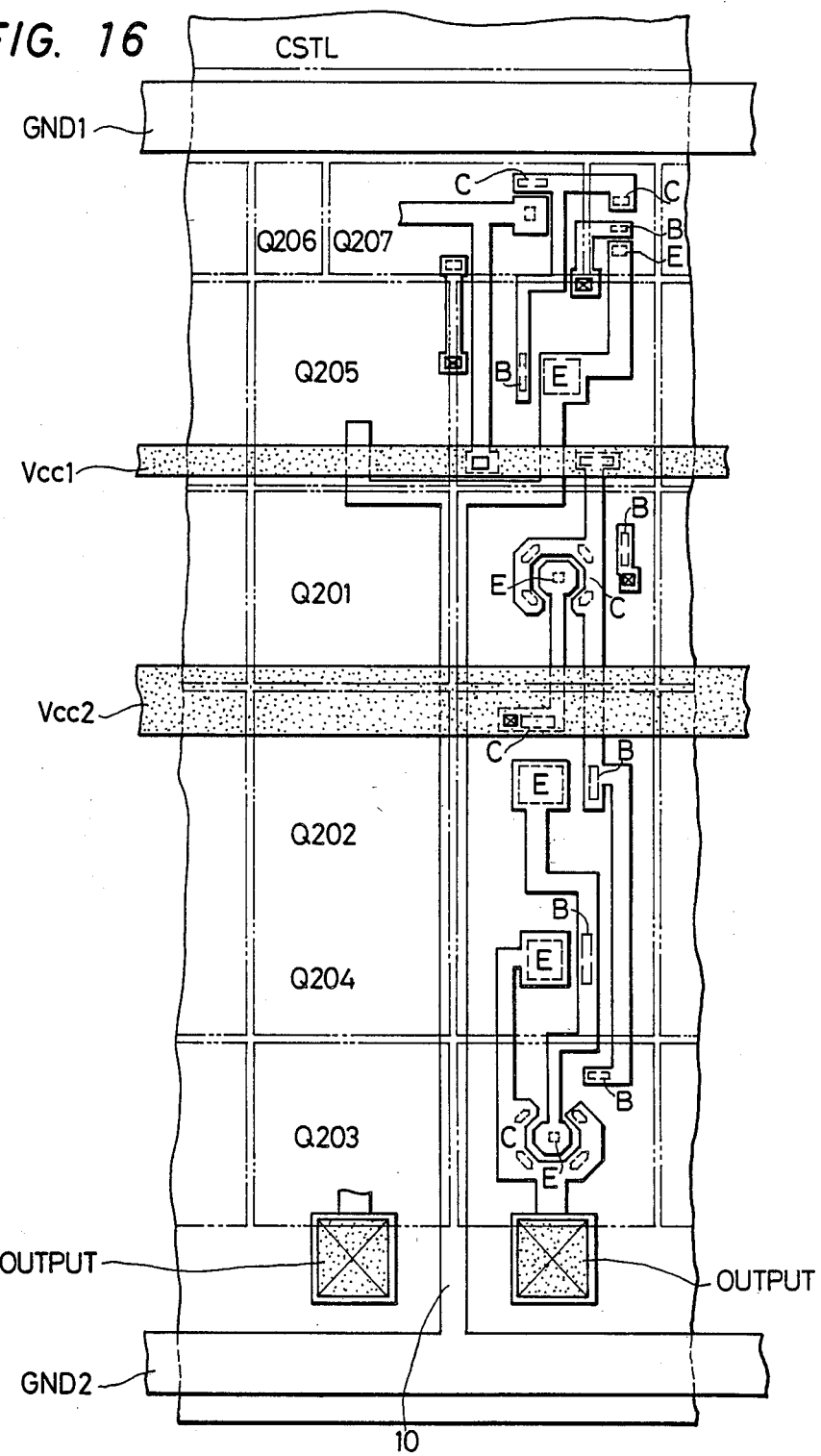
FIG. 16 is a top plan view showing in more detail one of the high voltage grid drivers according to the present invention.

FIG. 16 shows the layout of the high voltage grid driver to which the layout method of the high voltage anode driver is applied. High voltage transistors $Q_{201}$ to $Q_{205}$ are arranged outside of the chip whereas low voltage transistors $Q_{206}$ and $Q_{207}$ are formed inside of the former transistors.

Figure 17:
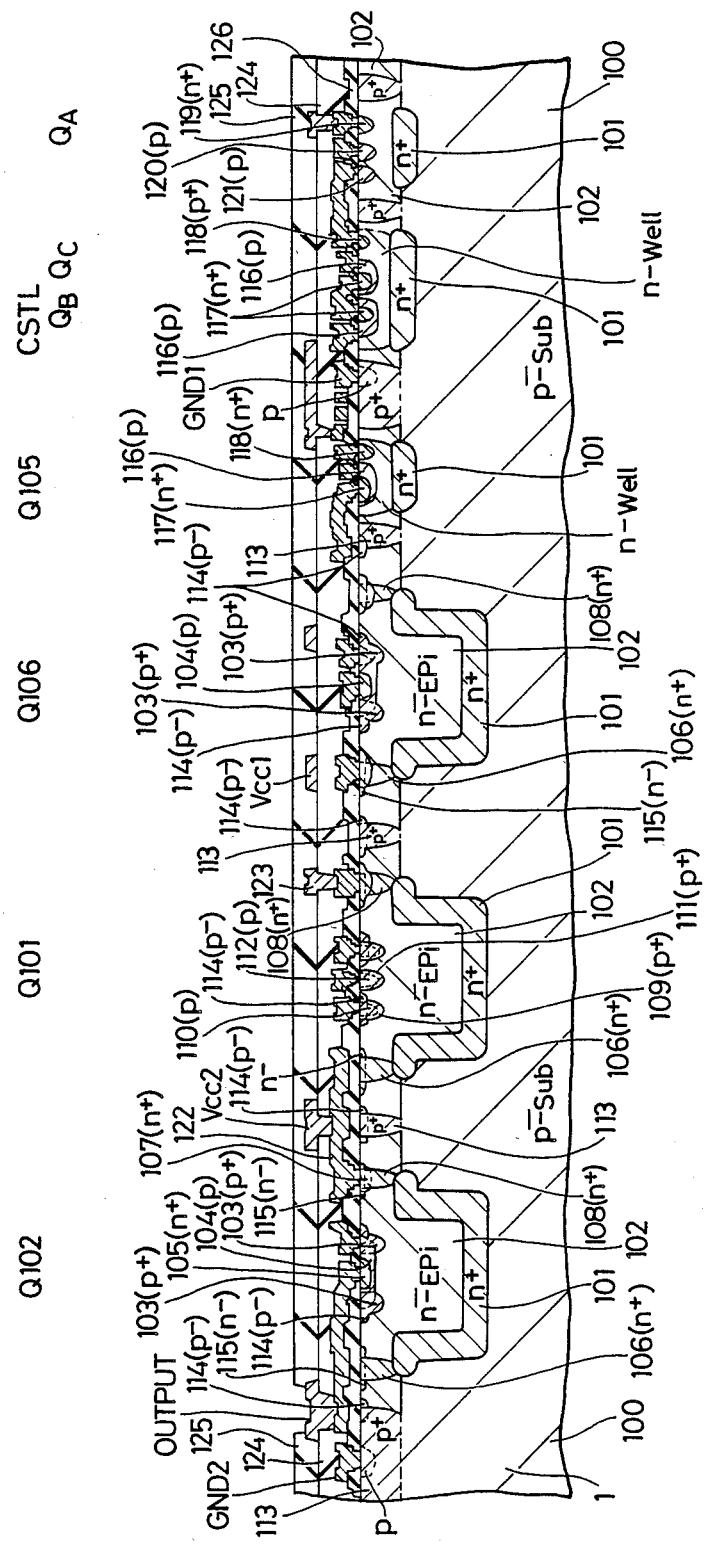
FIG. 17 is a section taken along line A—A' of FIG. 15.
Figure 18:
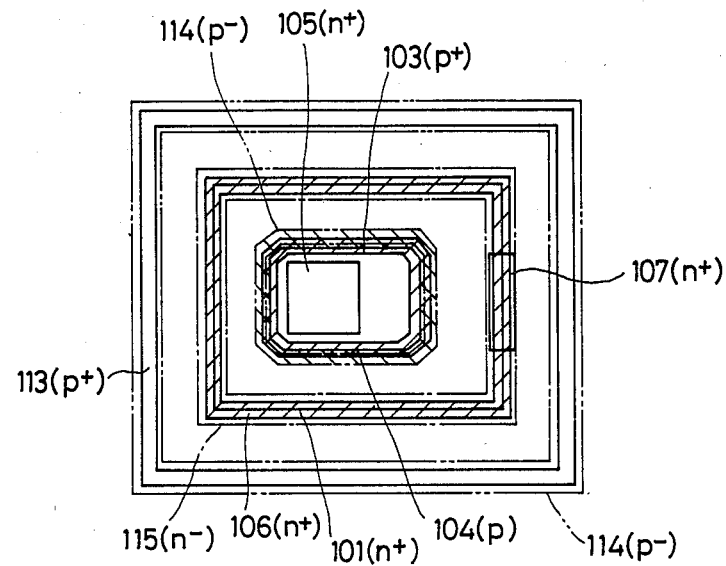
FIG. 18 is a top plan view showing a high voltage NPN transistor of FIG. 17.
Figure 19:
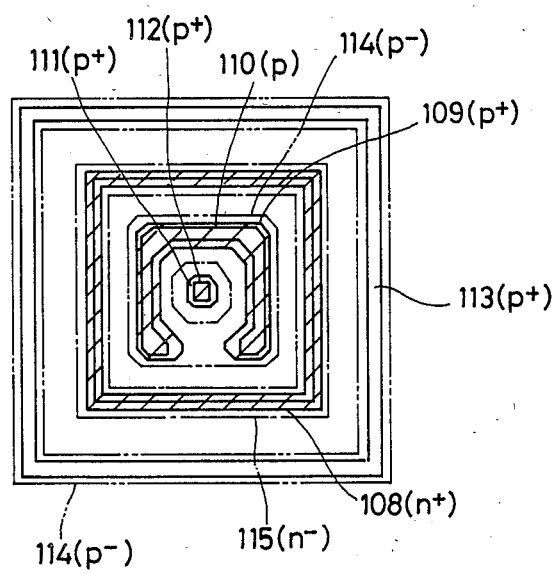
FIG. 19 is a top plan view showing a high voltage PNP transistor of FIG. 17.

Next, the device structure will be described with reference to FIGS. 17, 18 and 19. FIG. 17 is a section taken along line A—A' of FIG. 15. FIGS. 18 and 19 are top plan patterns showing the high voltage NPN transistors and the high voltage PNP transistors, respectively.

The lefthand side of the drawing shows the chip periphery whereas the righthand side shows the chip center.

As shown, the chip periphery is formed with the high voltage transistors $Q_{101}$, $Q_{102}$ and $Q_{106}$ whereas the chip center is formed with the low voltage transistor $Q_{105}$ and the high speed logic CSTL. Each element is formed by doping selectively the body surface, which is composed of a $P^-$-type substrate 100, an $n^+$-type buried layer 101 and an $n^-$-type epitaxial semiconductor layer 102, with impurities.

As shown in FIG. 17, the high voltage transistors $Q_{101}$, $Q_{102}$ and $Q_{106}$ are formed in the thick portion of the semiconductor layer 102 whereas the low voltage transistor and the CSTL element are formed in the thin portion of the semiconductor layer 102.

The high voltage transistors $Q_{102}$ and $Q_{106}$ are NPN transistors of grafted base construction, each of which is constructed of: a base region having a $P^+$-type layer 103 and a P-type layer 104; an emitter region having an $n^+$-type layer 105; and a collector region having the semiconductor layer 102, the buried layer 101, and $n^+$-type layers 106 and 107 and which has a pattern such as shown in top plan view in FIG. 18.

The high voltage transistor $Q_{101}$ is a PNP transistor which is constructed of: a base region having a buried layer 101, a semiconductor layer 102 and an $n^+$-type layer 108; a collector region having a $P^+$-type layer 109 and a P-type layer 110; and an emitter region having a $P^+$-type layer 111 and a P-type layer 112 and which has such a pattern as is shown in top plan view in FIG. 19.

In the aforementioned high voltage transistors, note that low-concentration $P^-$-type layers are formed in the peripheral edges and surfaces of the $P^+$-type layers 103 of the high voltage NPN transistors, the $P^+$-type layer 109 of the high voltage PNP transistor and isolation ($I_{SO}$) layers 113 of the respective high voltage transistors. This is because depletion layers are made liable to extend from the surfaces of the $I_{SO}$ layer below the high main line $V_{CC}$ (at 150 to 250 V) and from the $I_{SO}$ layers and the $P^+$-type layers 103 and 109 below the lines in the state, in which a potential as high as 150 to 250 V is applied to the lines between the high voltage transistors, to enlarge their curvature at the edge thereby raising the breakdown voltage. Even if the inter-layer insulating films are polarized by the high potential, moreover, the breakdown voltage can be prevented from becoming too low by providing $P^-$-type layer.

$N^-$-type layers 115 of low concentration are formed in the surfaces of the $n^+$-type layers 106 of the high voltage NPN transistors and the $n^+$-type layer 108 of the high voltage transistor. The reason for forming the $n^-$-type layers 115 will be described in the following. If a high potential as high as 150 to 250 V is applied to the collector regions of the high voltage NPN transistors and to the base region of the PNP transistor, the surfaces of the semiconductor layers 106 are easily inverted to elongate the depletion layers so that lines at a low potential are formed on the respective n+-type layers 106 and 108 and that the negative charges are released. Therefore, n−-type layers are formed to prevent inversions (i.e., parasitic channels) thereby raising the breakdown voltage. As shown in FIGS. 18 and 19, the n+-type layers 106 and the base regions of the NPN transistors $Q_{102}$ and $Q_{106}$ are formed so as to surround the n+-type layers 108 and the collector region of the PNP transistor $Q_{101}$ so that they themselves act as parasitic channel preventing layers.

Moreover, the top plan patterns of the base regions of the NPN transistors $Q_{102}$ and $Q_{106}$ and the collector region of the PNP transistor $Q_{101}$ have their corners blunted to enlarge the curvature of the depletion layers at the blunted corners.

As has been described hereinbefore, the high voltage transistors $Q_{101}$, $Q_{102}$ and $Q_{106}$ are formed in the thick portions of the semiconductor layers so that they can withstand high voltages, and the p−-type layers 114 and the n−-type layers 115 are devised to raise their breakdown voltages.

The low voltage transistor $Q_{105}$ and the NPN transistors $Q_B$ and $Q_C$ and PNP transistor $Q_A$ of the high speed logic CSTL element are formed and highly integrated in the thin portions of the semiconductor layers 102, as shown in FIG. 17.

The low voltage transistor $Q_{105}$ and the NPN transistors $Q_B$ and $Q_C$ of the CSTL element having the Schottky clamp diodes are constructed of: base regions having P-type layers 116; emitter regions having n+-type layers 117; and collector regions having n+-type layers 118, buried layers 101 and semiconductor layers 102.

The load PNP transistor $Q_A$ of the CSTL element is constructed of: a base region having an n+-type layer 119, a buried layer 101 and a semiconductor layer 102; an emitter region having P-type layer 120; and a collector region having a P-type layer 121.

In view of FIG. 17, it is notable that the semiconductor layers 102 forming the collector regions of the low voltage transistor $Q_{105}$ and the transistors $Q_B$ and $Q_C$ of the CSTL element having the Schottky clamp diodes have their impurity concentrations increased effectively by an n type well layer 122 so that they have their parasitic resistances reduced to speed up operation. Especially in the high speed CSTL element, as has been described above, the parasitic series resistance of the Schottky clamp diodes is reduced by the n-type well layer 122 so as to speed up operation.

As has been described hereinbefore, moreover, the main lines ($V_{CC1}$, $V_{CC2}$, GND1 and GND2) are arranged so that the high speed logic is not adversely affected by of potential as high as 150 to 250 V.

By making the various devices described hereinbefore, it is possible to achieve the required performance of the high voltage elements of 150 to 250 V and the high speed logic CSTL element while allowing the high voltage elements and the CSTL element to coexist on the same common chip, and to eliminate adverse affects that the elements might have on each other.

The first layer line 122 is made of aluminum, and a second layer line 123 is made of either aluminum or of aluminum containing silicon. An interlayer insulating film 124 and a final protecting film 125 are made of a polyimide resin. Numeral 126 indicates a surface oxide film.

With the present invention, the following effects can be achieved:

(1) Since the CSTL element of small size is arranged at the chip center whereas the high voltage elements of large sizes are arranged on the chip periphery, the large high voltage elements can be laid out in the chip periphery without any dead space so that high integration can be achieved.

(2) Since the logic ground line GND1 and the ground line GND2 for the high voltage driver are formed separately from each other, those two types of elements will not interfere with each other electrically so that their reliability can be improved.

(3) Since the logic ground line GND1 is formed so as to enclose the CSTL element forming region; since the high potential line $V_{CC2}$ is formed outside of the ground line GND1; and since the high speed logic line $V_{CC1}$ is formed between the two lines GND1 and the $V_{CC2}$, the electric field established by the high potential line can be shielded so as not to reach the low voltage element forming region thereby enhancing the reliability of the high speed logic.

(4) Since the ground line GND2 for the high voltage driver is formed in the chip periphery outside of the high potential line $V_{CC2}$ and since the output terminal OUTPUT is formed in the vicinity of the inner side of that ground line, the output terminal OUTPUT can be kept away from the electric field coming from the high potential line $V_{CC2}$ and can be prevented from being corroded so as to be highly reliable because it is made resistant to be ionization by the high electric field even if water enters from the chip periphery.

(5) In the layout of the high voltage driver composed of the high voltage transistors and the low voltage transistor, the high voltage transistors of larger sizes are arranged in the chip end whereas the low voltage transistor of smaller size are arranged in the chip center. As a result, the low voltage transistor can be laid out without any dead space so that high integration can be achieved.

(6) Since the lightly doped n−-type layers are formed in the deep n+-type diffusion layers in the regions formed with the high voltage transistors, the depletion layers, which might otherwise start to extend from the P-type regions (e.g., the base diffusion or isolation diffusion regions), for example, by forming the low potential line on and applying the low potential to the epitaxial layers in the element regions, can be prevented from being subjected to the concentration of the electric field in the deep n+-type diffusion layers so that a high breakdown voltage can be attained.

(7) Since the lightly doped P-type layers are formed in the desired portions of the regions formed with the high voltage transistors, the depletion layers are more likely to be generated in those portions and to have large curvatures so that a high breakdown voltage can be attained.

(8) Since the impurity concentrations of the semiconductor layers forming both the collector regions of the low voltage transistor and the NPN transistors of the CSTL element and the resistance regions just below the Schottky of the CSTL element are increased by the n-type well layers, the parasitic resistances of the corresponding portions can be reduced to speed up the two types of elements.

(9) Since the high voltage elements are formed in the thick portions of the semiconductor layers of the chip periphery whereas the CSTL element is formed in the thin portion of the semiconductor layer of the chip center, the high speed and integration of the elements requiring high speed operation can be achieved, while raising the voltage of the elements requiring a high breakdown voltage, so that the two types of elements can coexist on the same chip.

Embodiment 3

Description of the Fabrication Process Features

Next, the process for fabricating the coexisting IC having high voltage elements and high speed and low voltage elements shown in FIG. 17 will be described with reference to FIGS. 20 to 46. In these Figures, a region $X_1$ is a partially sectional view showing each step of forming the high voltage NPN transistor $Q_{102}$ and the high voltage PNP transistor $Q_{101}$ (of FIG. 17), and a region $X_2$ is a partially sectional view showing each step of forming a low voltage transistor $Q_{105}$ and the CSTL element (of FIG. 17). In the respective drawings, the lefthand side indicates the chip end, and the righthand side indicates the chip center.

Figure 20:
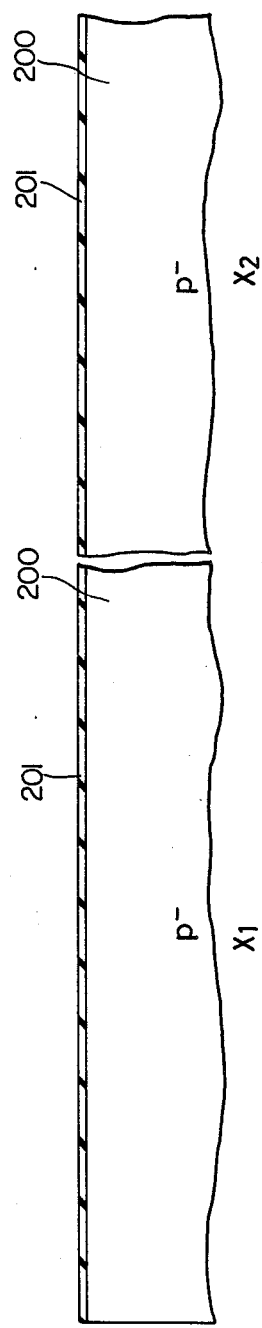

As shown in FIG. 20, there is prepared a semiconductor body 200 of first conductivity type, which has formed on its principal face an oxide (which will be referred to as "SiO$_2$", although it is not limited thereto) film 201. As this semiconductor body 200, for example, the 100 face, there is used a semiconductor body of, e.g., silicon, of p-type single crystal of high resistance, which has a face (110) inclined at about 45 degrees from the orientation flat side. The SiO$_2$ film 201 is made to have a thickness of about 0.8 microns by thermally oxidizing the surface of the semiconductor body.

Figure 21:
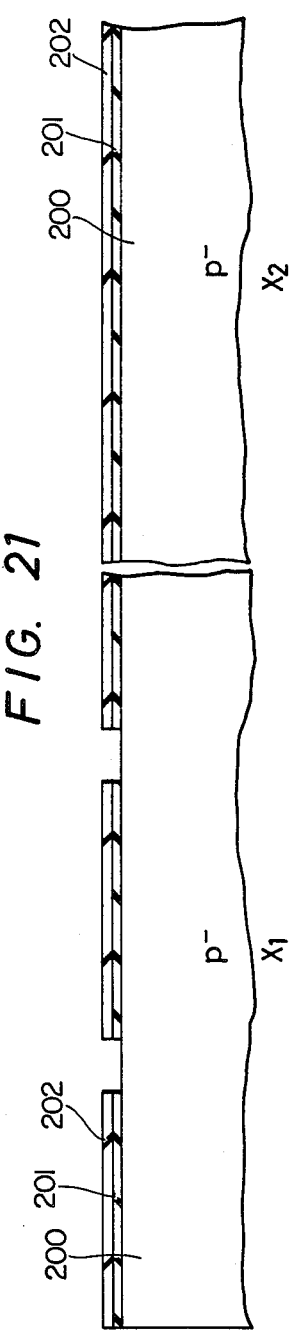

Next, in order to remove the SiO$_2$ lying over the region to be formed with a semi-well, which will be described later, as shown in FIG. 21, a photo-resist film 202 is formed on the SiO$_2$ film, and this SiO$_2$ film is etched by using the photo-resist film as a mask, using conventional photolithographic and etching techniques.

Figure 22:
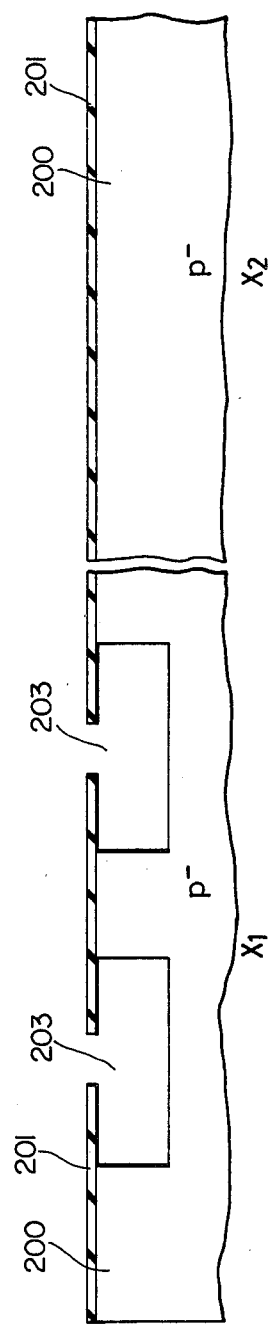

Next, the photo-resist film is removed, and the semiconductor body 200 is etched by using the SiO$_2$ film as a mask. For example, an aqueous solution of potassium hydroxide (KOH) is used as an anisotropic etching liquid. This etching liquid exhibits anisotropic etching characteristics for the body 200 of single-crystal silicon. FIG. 22 shows the etching state of the section taken along the <100> axis. In this case, the etching depth, i.e., the depth of a semi-well 203, is equal to the length of the overhang of the SiO$_2$ film over the semi-well. This is because the side and bottom faces of the semi-well exhibit the {100} faces so that the etching rates become equal. The section in the direction of <110> axis provides a well (not shown) in which the semi-well 203 has its bottom face formed of the (100) face and its side face formed of the (111) face.

After the exposed (or etched) face of the body 200 is thermally oxidized to form a thin SiO$_2$ film (not shown), a photo-resist film (not shown) is formed selectively in the region other than that in which a buried layer is to be formed. Then, the SiO$_2$ film on the buried layer forming region is etched by using that photo-resist film as a mask. After this, the photo-resist film is removed.

Figure 23:
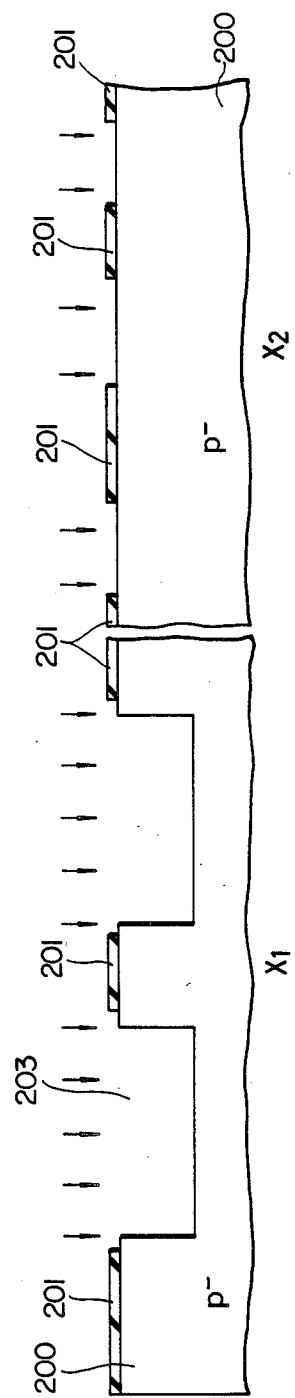

Next, as shown in FIG. 23, an impurity is introduced by using the SiO$_2$ film 201 on the body 200 as a mask. The impurity to be used has an N-type conductivity such as antimony (Sb), and the introduction is conducted by deposition and diffusion. Thus, as done conventionally, a glass containing Sb is deposited on the body and the Sb is introduced into the body therefrom. This impurity introduction is performed simultaneously for the regions $X_1$ and $X_2$.

Figure 24:
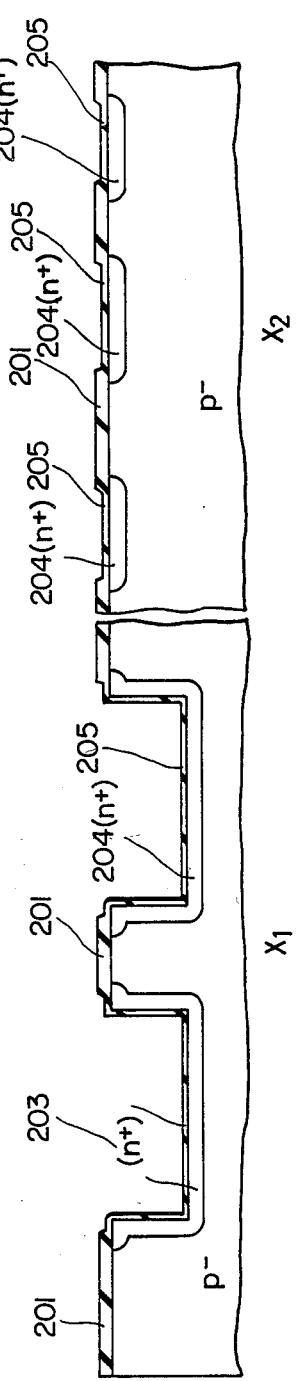
Figure 25:
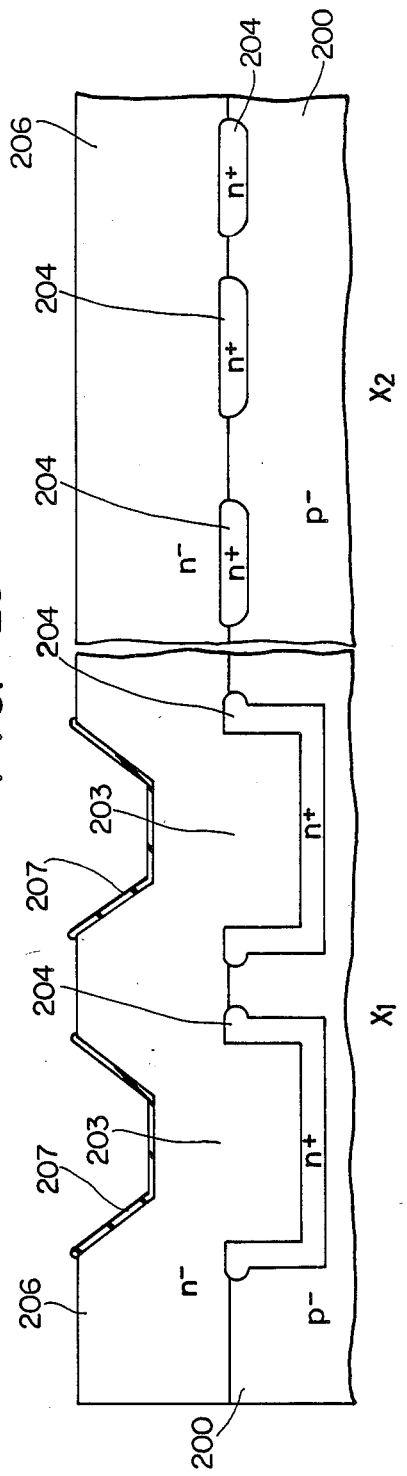

Next, after the Sb-containing glass (not shown) is removed, the N-type impurity is thermally diffused to form a buried layer 204. Then, the state shown in FIG. 24 is established. By the thermal diffusion at this time, a thin oxide (i.e., SiO$_2$) film 205 is formed on the buried layer 204. This buried layer 204 acts as the base region of a PNP transistor and as the collector region of an NPN transistor. Next, the SiO$_2$ films 201 and 205 are removed from the body 200, and a silicon single-crystal (which will also be called a "semiconductor layer") 206 is made to grow all over the surface of the body 200. This silicon single-crystal 206 is formed by epitaxial growth. The semiconductor layer 206 preferably has a thickness of about 45 microns (i.e., the thickest portion of layer 206 in the $X_1$ region is 45 microns), a specific resistance of about 17.5 Ωm and an N conductivity type. Next, an oxide film 207 having a thickness of 0.8 microns is formed by thermal oxidation on the surface of that semiconductor layer 206.

Next, a photo-resist film (not shown) is selectively formed and is used as a mask for the removal of the aforementioned SiO$_2$ films other than those lying on the semi-well 203. And, that photo-resist film is removed to establish the state shown in FIG. 25. The remaining SiO$_2$ films 207 act as the mask which is used to flatten the semiconductor layers 206, as will be described hereinafter. Moreover, the SiO$_2$ films 207 are present partially in the region $X_1$ to be formed with the high voltage transistors but not in the region $X_2$ to be formed with the low voltage transistor or the small signal transistor. On the other hand, the buried layers 204 are slightly diffused into the semiconductor layer 206 by the heat which is applied for forming the semiconductor layer 206.

Figure 26:
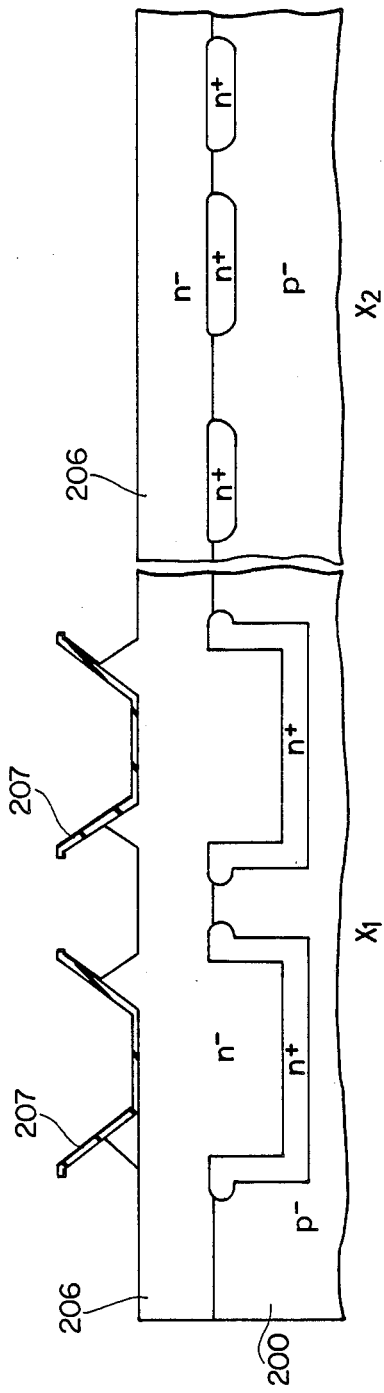

Next, as shown in FIG. 26, the semiconductor layer 206 is etched by using the SiO$_2$ films 207 as a mask. The KOH solution is used as the etching liquid. This etching step is conducted to flatten the semiconductor layer 206. As a result, the flat surface of the semiconductor layer 206 is formed in the region $X_2$. In the region $X_1$, on the other hand, the vicinity of the slopes of the SiO$_2$ films 207 are raised, but the remaining etched face is left flat in a horizontal plane.

Figure 27:
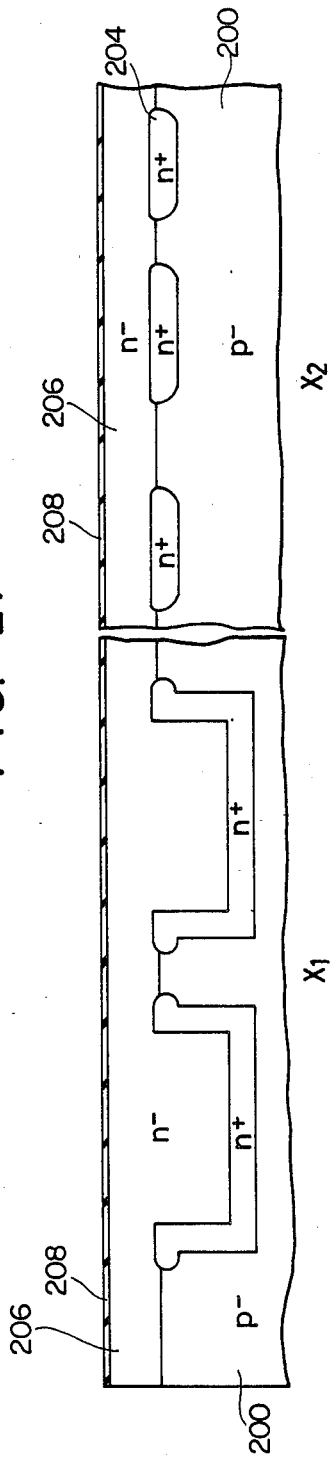

Next, the SiO$_2$ films 207 are removed, and the semiconductor layer 206 is etched and flattened all over its surface. The etching liquid used is the KOH solution. By this etching, the thickest semiconductor layer 206 in the region $X_1$ desirably has a thickness of about 30 microns whereas the semiconductor layer 206 in the region $X_2$ desirably has a thickness of about 10 microns. This is because the region $X_1$ for forming the high voltage transistors is intended to have its breakdown voltage raised by the depth of the well obtained whereas the low voltage transistor or the low signal transistor is intended to be highly integrated by thinning the semiconductor layer 206 of the region $X_2$. Thus, the depth of the well and the thickness of the epitaxial layer are so determined that the thicknesses of the semiconductor layer 206 of the regions $X_1$ and $X_2$ may be determined to optimize the characteristics of the transistors to be formed in the respective regions. Next, an oxide film 208 having a thickness of 0.8 microns is formed in the surface, as shown in FIG. 27.

Figure 28:
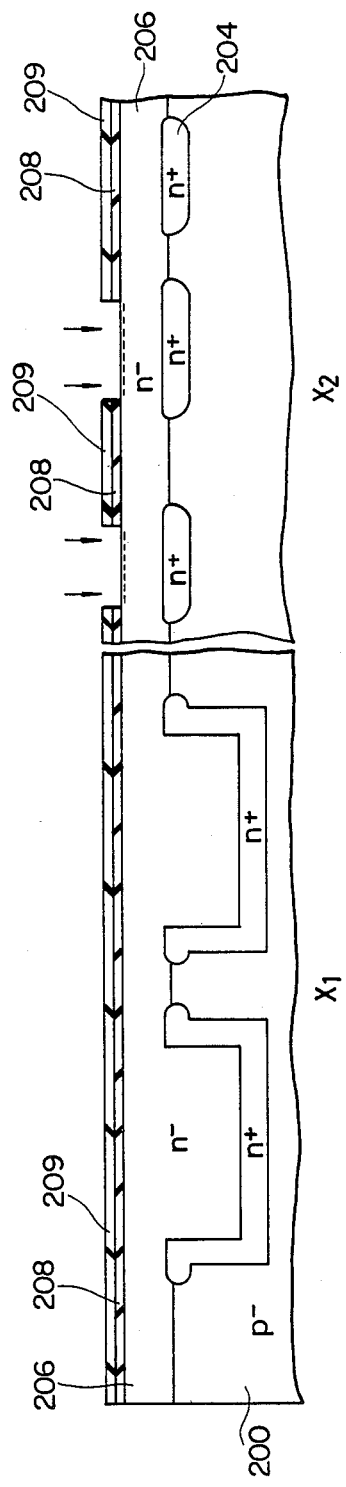

Next, photo-resist films 209 are selectively formed on the oxide film 208. By using these photoresist films 209 as masks, the oxide films 208 lying on the collector region of the low voltage NPN transistor to be formed in the region $X_2$ and on the collector region of the NPN transistor or the low signal transistor of the complementary Schottky transistor logic (which will be shortly referred to as the "CSTL") are etched to expose the semiconductor layer 206. Then, with the photo-resist films 209 remaining, an impurity is introduced into the semiconductor layer 206 exposed, as shown in FIG. 28. The impurity used is an N-type impurity such as phosphorus (P). The introduction method used is, e.g., ion implantation. It is preferred that the implanting energy be 125 KeV and the dosage $1 \times 10^{13}$ atoms/cm$^2$. This impurity introduction forms a N well to be described later.

Figure 29:
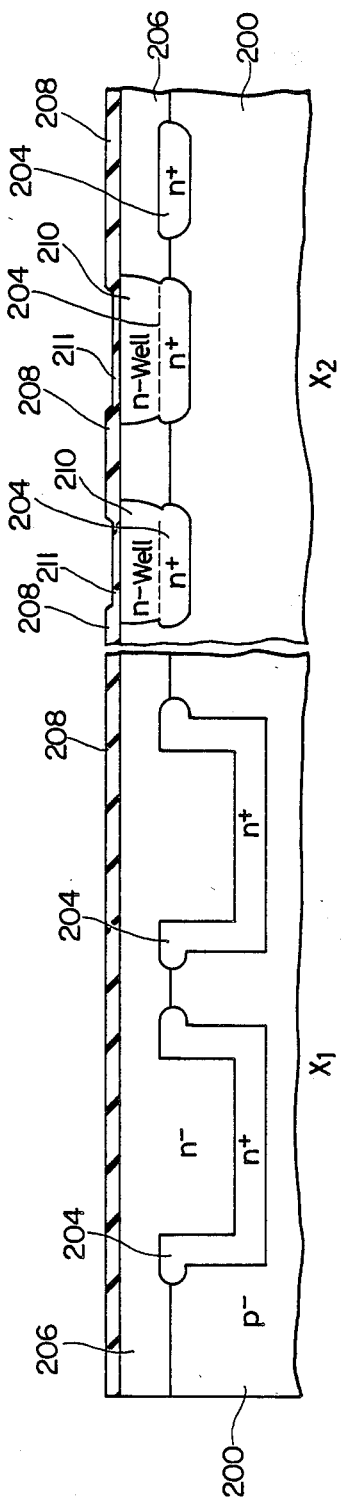

Next, N wells 210 are formed by thermal diffusion, as shown in FIG. 29. The N wells are made to diffuse to reach the buried layers 204. During this time of thermal diffusion, thin oxide films 211 are formed on the N wells. The reasons for forming the N wells are as follows. Specifically, the series resistances of the collector of the low voltage NPN transistor and the Schottky barrier diode (which will be shortly referred as an "SBD") of the CSTL element are reduced to speed up the respective transistors. The base region of the PNP transistor of the CSTL element may be formed with the N well but is not formed in the present invention because a power amplification factor $h_{FE}$ is reduced.

Figure 30:
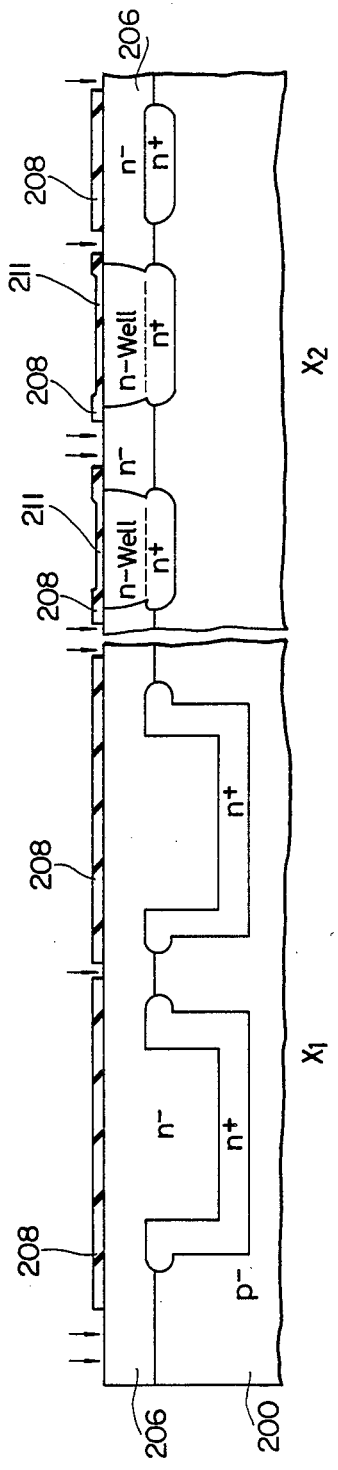

Next, in order to form element isolation regions (hereafter referred to as "$I_{SO}$") which will be described later, as shown in FIG. 30, an impurity is introduced into the exposed faces of the semiconductor layer 206 by using as the mask the oxide films 208 which are selectively removed. The impurity used is a P-type impurity such as boron (B). The introduction method used is, e.g., deposition and diffusion, as done conventionally. Thus, a compound that is a source of the boron impurity is deposited on the body 200, and the boron is introduced therefrom into the body. In FIG. 30, the oxide films 208 on the $I_{SO}$ regions are etched and removed by using the photo-resist films (not shown) which are formed selectively on the surface oxide films 208 and 211 as the masks. This impurity introduction is conducted for the regions $X_1$ and $X_2$ and in the thin portions of the semiconductor layer 206.

Next, $I_{SO}$ regions 212 are formed by the thermal diffusion, as shown in FIG. 31. This diffusion for forming the $I_{SO}$ regions is conducted initially to arrive midway between the semiconductor layer 206; however, as shown in FIG. 33, such $I_{SO}$ regions are to finally reach the P-type body 200. As a result, the electrically isolated regions are formed in the respective regions $X_1$ and $X_2$. A thin SiO$_2$ film 213 is formed on the $I_{SO}$ regions 212 during the thermal diffusion.

In order to form the leads of the collector electrode of the high voltage NPN transistors and the base electrode of the high voltage PNP transistor of the region $X_1$, as shown in FIG. 32, an impurity is introduced into the semiconductor layer 206. The impurity used is an N-type impurity such as phosphorus (P). The preferable introduction method is deposition and diffusion, as done conventionally. Thus, the phosphorus is introduced from a phosphosilicate glass deposited on the semiconductor body. The surface oxide films 208 on the respective electrode leading-out regions are etched and removed by using photo-resist films (not shown) which are formed selectively on the surface oxide films 208. After this, the photo-resist films are removed, followed by the aforementioned impurity introduction step. This impurity introduction is conducted only for the region $X_1$, not for the low voltage transistor and the low signal transistor of the CSTL element to be formed in the region $X_2$. This is because the integration density of the transistors to be formed in the region $X_2$ is to be improved. If necessary, however, the impurity may be introduced into the low signal transistor forming region to drop the collector series resistance. Moreover, this impurity introduction is conducted to enclose the base regions of the high voltage NPN transistors and the collector region of the high voltage PNP transistor and to act as the channel stopper.

Next, after removal of the phosphosilicate glass, a heat treatment, for thermal diffusion of the phosphorus is conducted to form the $I_{SO}$ regions 212, the collector electrode leading-out layers 214 of the high voltage NPN transistors and the base electrode leading-out layer 215 of the high voltage PNP transistor, as shown in FIG. 33. The $I_{SO}$ regions 212 are formed to reach the P-type body 200, and the electrode leading-out layers 214 and 215 are formed to reach the end portions of the buried layers 204, i.e., the buried layers which are located in the thin portions of the semiconductor layer 206. During this heat treatment, thin oxide films (not shown) are formed on the electrode leading-out layers 214 and 215.

Next, photo-resist films (not shown) are selectively formed and are used as the masks to etch and selectively remove the oxide films 208 lying on the peripheral edge of the base regions of the high voltage NPN transistors and on the collector and emitter regions of the high voltage PNP transistor. Then, after removal of the photo-resist films, an impurity is introduced through the resultant apertures, as shown in FIG. 34. The impurity used is a P-type impurity such as boron (B). The preferred introduction method is deposition and diffusion, as done conventionally. Thus, a phosphosilicate glass containing boron is deposited on the semiconductor body, and boron therefrom is introduced into the semiconductor body. The P-type regions are formed in the peripheral edges of the base regions of the high voltage NPN transistors so as to enlarge the curvatures of the edge portions of the depletion layers.

As shown in top plan view in FIGS. 18 and 19, moreover, the diffusion pattern is made so polygonal as to have corners of 90 degrees or more. This is intended to enlarge the curvatures of the depletion layers at the corners thereby to raise the breakdown voltage.

Figure 35:
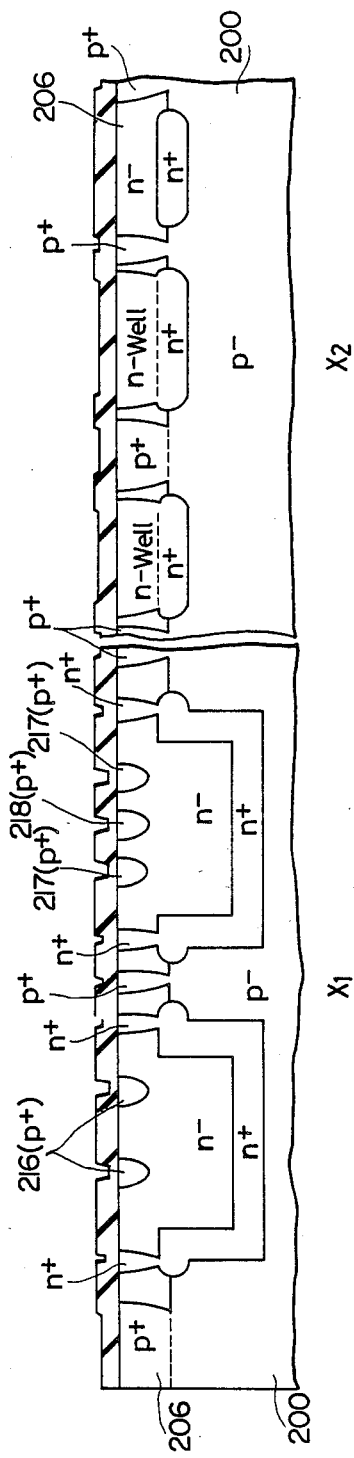

Next, after removal of the phosphosilicate glass, a heat treatment is conducted to form p$^+$-type diffusion layers 216 to 218, as shown in FIG. 35. By this heat treatment, thin oxide films are formed on the p$^+$-type diffusion layers. Of these, the diffusion layers 216 provide the peripheral edge portions of the base regions of the high voltage NPN transistors. The diffusion layers 217 provide the collector region of the high voltage PNP transistor. The diffusion layer 218 provides the emitter region of the high voltage PNP transistor.

Figure 36:
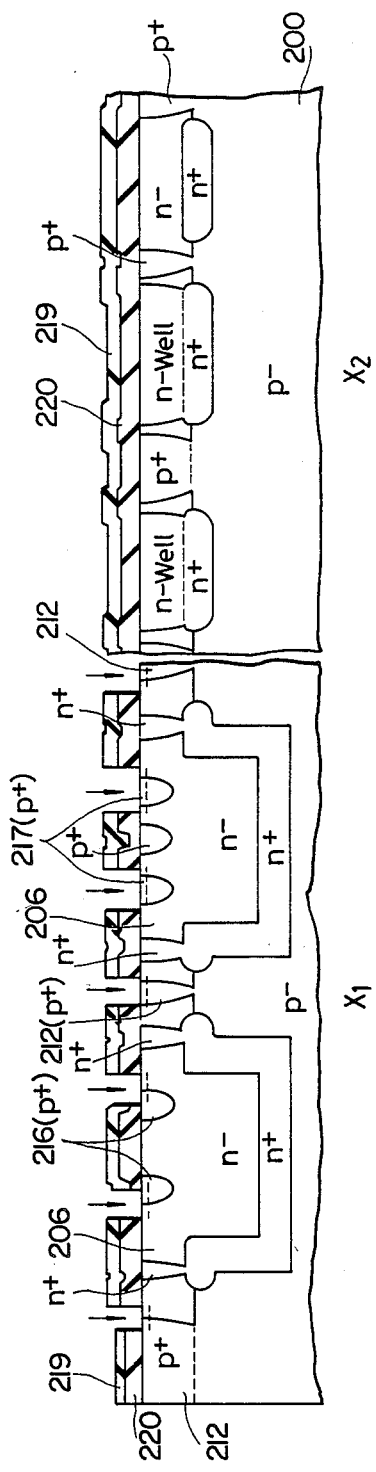

Next, a photo resist film 219 is selectively formed. And, this film 219 is used as the mask to etch a surface oxide film 220 thereby to expose the clean faces of the semiconductor layer 206 to the outside. After this, with the resist film 219 remaining, an impurity is introduced, as shown in FIG. 36. The impurity used is a P-type impurity such as boron (B). The introduction method used is ion implantation. It is preferable that the implanting energy be 75 KeV and that the dosage be $1 \times 10^{13}$ atoms/cm$^2$. This impurity concentration is sufficiently lower than those of the $I_{SO}$ layers, the p$^+$-type diffusion layers and so on. This ion implantation is conducted to cover either the edge portions of the surfaces of the $I_{SO}$ layers 212 of the region $X_1$ to be formed with the high voltage elements or the surfaces of the $I_{SO}$ layers 212. The ion implantation is also conducted to cover the surroundings of the p$^+$-type diffusion layers 216 and the surfaces of the p$^+$-type diffusion layers 217. The reason why the ions are implanted into the $I_{SO}$ layers is to make the depletion layers liable to extend from the $I_{SO}$ layers below the main line $V_{CC2}$ (at 150 to 250V) and from the $I_{SO}$ layers below the lines between the high voltage elements in the state, in which a voltage as high as 150 to 250 V is applied to the lines, thereby raising the breakdown voltage. If a high voltage line of or a line to have a high voltage is to be formed above the $I_{SO}$ layers, more specifically, the semiconductor layers near the surfaces of the $I_{SO}$ layers form inversion layers so that the depletion layers extending from the $I_{SO}$ layers at the ground potential are unable to extend due to the inversion layers of the surface. As a result, the curvature is enlarged so as to be liable to breakdown. In order to eliminate the inversion layers of the surface, therefore, the aforementioned P-type ion implantation is conducted. Ion implantation to be conducted into both the surroundings of the p$^+$-type diffusion layers 216 and the surfaces of the p$^+$-type diffusion layers 217 is intended to make the depletion layers liable to extend from the surface of the semiconductor layer 206 so that the curvature is further enlarged to raise the breakdown voltage.

Next, the photo-resist film 219 is removed, and a photo-resist film 221 is newly formed in a selective manner. And, this photo-resist film 221 is used as the mask to etch the surface oxide film 220, and an impurity is introduced, as shown in FIG. 37. The impurity used is an N-type impurity such as phosphorus (P). The introduction method used is ion implantation. It is preferred that the implanting energy be 125 KeV and that the dosage be $5 \times 10^{12}$ atoms/cm$^2$. This impurity introduction is conducted for the surfaces of the electrode leading-out layers 214 and 215 which have been formed, as shown in FIG. 33. The reason for this impurity introduction will be described in the following. If lines having a low potential, for example, are formed on the respective electrode leading-out layers 214 and 215 if a voltage as high as 150 to 250 V is applied to both the collector regions of the high voltage NPN transistors and the base region of the high voltage PNP transistor, the surface of the semiconductor layer 206 is inverted by those lines thereby extending depletion layers. Therefore, N-type ion implantation is conducted to limit inversion. As shown in FIGS. 18 and 19, moreover, ion implantation is conducted to cover the electrode leading-out layers 114 and 115.

Next, the photo-resist film 221 is removed by the method using ozone sulfuric acid, and the substrate is subjected to a heat treatment to form p$^-$-type diffusion layers 222 and N$^-$-type diffusion layers 223. This heat treatment is conducted so as to remove crystal defects made by ion implantation, and to electrically activate ions. With this heat treatment, moreover, a oxide film (not numbered) having a thickness of 0.8 microns is formed on the surface of the semiconductor layer 206 subjected to the ion implantation.

Figure 39:
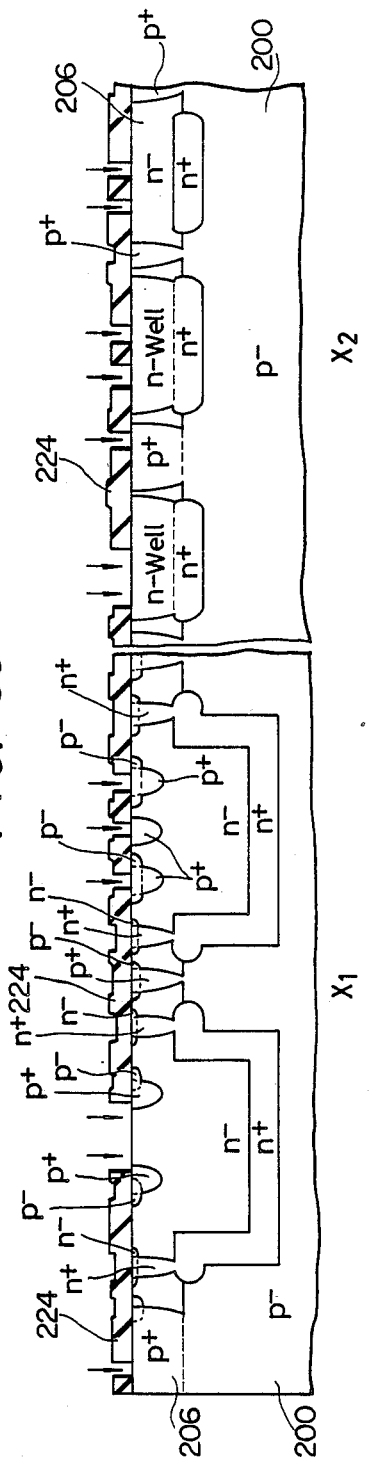

Next, photo-resist films (not shown) are formed on surface oxide films 224. These photo-resist films are used as the masks to etch the surface oxide films 224. After this, the photo resist films are removed, and an impurity is introduced, as shown in FIG. 39. The impurity used is a P-type impurity such as boron (B). The introduction method used is deposition and diffusion. This introduction forms the electrode leading-out portions of the base regions of the high voltage NPN transistors and the collector and emitter regions of the high voltage PNP transistor, and the electrode leading-out portions in the $I_{SO}$ layers in the base region of the low voltage NPN transistor, the base region of the NPN transistor of the CSTL element, the collector and emitter regions of the PNP transistor of the CSTL element, and the region, over which the ground lines GND1 and GND2 are to be formed, so as to ground the body 200 to the earth.

Figure 40:
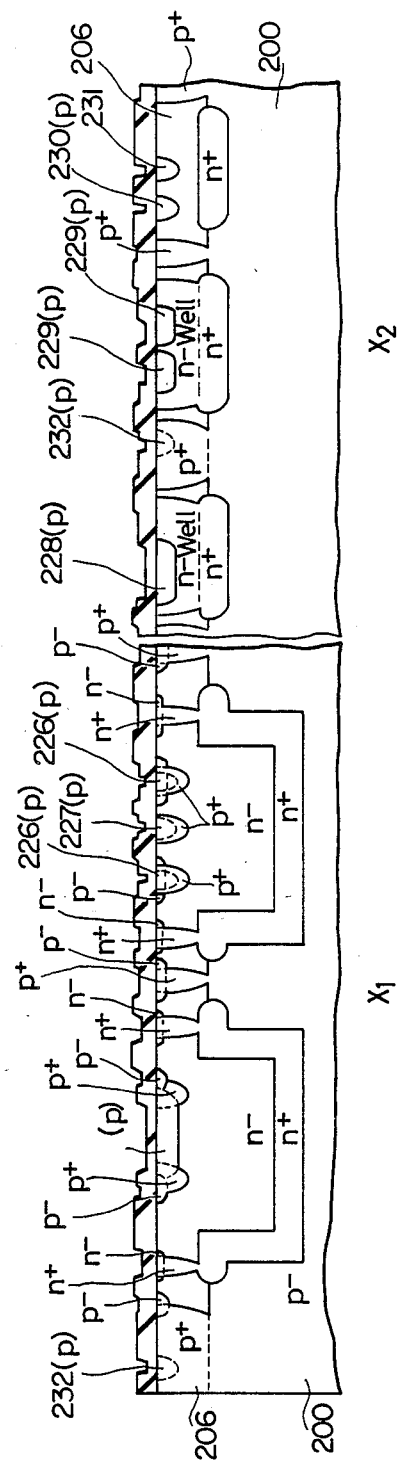

Next, by a heat treatment P-type diffusion layers 225 to 232 are formed, as shown in FIG. 40. Of these: numeral 225 indicates the base regions of the high voltage NPN transistors; numerals 226 and 227 the collector electrodes of the high voltage PNP transistor; numeral 228 the base region of the low voltage NPN transistor; numeral 229 the base region of the NPN transistor of the CSTL element; numerals 230 and 231 the collector regions of the PNP transistor of the CSTL element; and numeral 232 the emitter region or the electrode leading-out region for grounding the body 200 of the lines GND1 and GND2 to the ground. During this heat treatment, thin oxide films are formed on the P-type diffusion layers 225 and 232.

Next, photo-resist films (not shown) are formed selectively on the surface oxide film and are used as masks to etch the surface oxide film.

Next, the photo-resist films are removed, and the oxide film is used as the mask to introduce an impurity, as shown in FIG. 41. The impurity used is an N-type impurity such as arsenic (As) or phosphorus (P). The introducing method used is deposition and difusion. Thus, a phosphosilicate glass, e.g., containing arsenic if arsenic is the impurity to be introduced, is deposited on the semiconductor body and the impurity introduced therefrom into the body. This impurity introduction is conducted for the emitter regions and the collector electrode leading-out portions of the NPN transistors and for the base electrode leading-out portions of the PNP transistor. The impurity is introduced into the electrode leading-out portions to make ohmic contact with a first conductor layer which will be described later.

Next, a heat treatment is conducted to form n$^+$-type diffusion layers 233 to 235, as shown in FIG. 42. Of these: numeral 233 indicates the emitter regions of the NPN transistors; numeral 234 indicates the collector electrode leading-out portions of the NPN transistors; and numeral 235 indicates the base electrode leading-out portion of the PNP transistor. During formation of such n$^+$-type diffusion layers are formed, by that heat treatment, thin oxide films 237. The reason why the phosphosilicate glass is not removed at this diffusion step is to form a phosphosilicate glass (PSG) film thereby to trap the movable ions such as Na$^+$ ions.

Next, a photo-resist film (not shown) is selectively formed and is used as the mask to remove, e.g., by etching, the aforementioned thin oxide films 237 so that contact holes are formed only over the $n^+$-type diffusion layers 233 to 235 formed at the previous step. By this etching, both the thin oxide films at the desired portions and the thicker oxide films at the desired portions over the aforementioned P-type diffusion layers 225 to 232, for example, the thicker oxide films in the positions where the SBD of the NPN transistor of the CSTL element (which will be described later) with the clamp diode is to be formed, are etched. However, this etching depth is as large as the thickness of the oxide films 237.

With the last-mentioned photo-resist film remaining, another photo-resist film (not shown) is again formed in a selective manner. And, that photo-resist film is used as the mask to etch the thin oxide films at the desired portions and the thicker oxide films at the desired portions of the aforementioned P-type diffusion layers 225 to 232 thereby to form the contact holes.

Next, all the photo-resist films are removed, and the first conductor layer is then formed all over the surface. The first conductor layer used is aluminum (Al), for example. The forming method preferred is vacuum evaporation. The film thickness adopted is 1.0 micron. Next, a photo-resist film (not shown) is used as the mask to pattern-etch the aluminum. After removal of the photo-resist film, moreover, conductor layers 238 to 257 are formed, as shown in FIG. 43. Of these, numerals 238 and 239 indicate the lines GND2 and GND1, respectively. Numerals 240, 241 and 242 indicate the emitter (E), base (B) and collector (C) electrodes of the high voltage NPN transistors, respectively. Numerals 243, 244 and 245 indicate the collector (C), emitter (E) and base (B) electrodes of the high voltage PNP transistor, respectively. Numerals 246, 247 and 248 indicate the emitter (E), base (B) and collector (C) electrodes of the low voltage NPN transistor, respectively. Numerals 249 to 251 indicate lines. Numerals 252 to 257 indicate the respective electrodes of the Schottky clamp NPN transistor (which will also be called the "NPN transistor") of the CSTL and the PNP transistor. Letters B, E and C indicate the base, the emitter and the collector, respectively.

The CSTL element is basically constructed such that the common collector of the two Schottky clamp NPN transistors is connected with the collector of the PNP transistor acting as a load. Numeral 255 indicates an electrode connecting the collector of that PNP transistor and the common collector of the two Schottky clamp NPN transistors.

Next, an interlayer insulating film between the first conductor layer and a second conductor layer which will be described later is formed all over the surface. The interlayer insulating film used is made of, e.g., a polyimide resin. The forming preferred method uses a spinner applicator. The film thickness may be as much as 2.2 microns. This is because the polyimide resin used has excellent insulating properties and excellent spreading properties. Although the polyimide resin film is formed in the present embodiment by a single application, it may be formed by two or more applications. Next, a photo-resist film (not shown) is formed on the polyimide resin and is used as the mask to etch the polyimide resin 258 to form through holes 259 to 263 for electrically connecting the first conductor layer and a second conductor layer which will be described later. And, the aforementioned photo resist film is removed to establish the state shown in FIG. 44.

Next, the second conductor layer is formed all over the surface. The forming method used is, e.g., vacuum evaporation. The second conductor layer preferred is aluminum containing silicon which has a thickness of. e.g., 1.75 microns.

Next, a photo-resist film (not shown) is formed selectively on the second conductor layer. And, this photo resist film is used as the mask to pattern-etch the second conductor layer and to etch the residual silicon.

Figure 45:
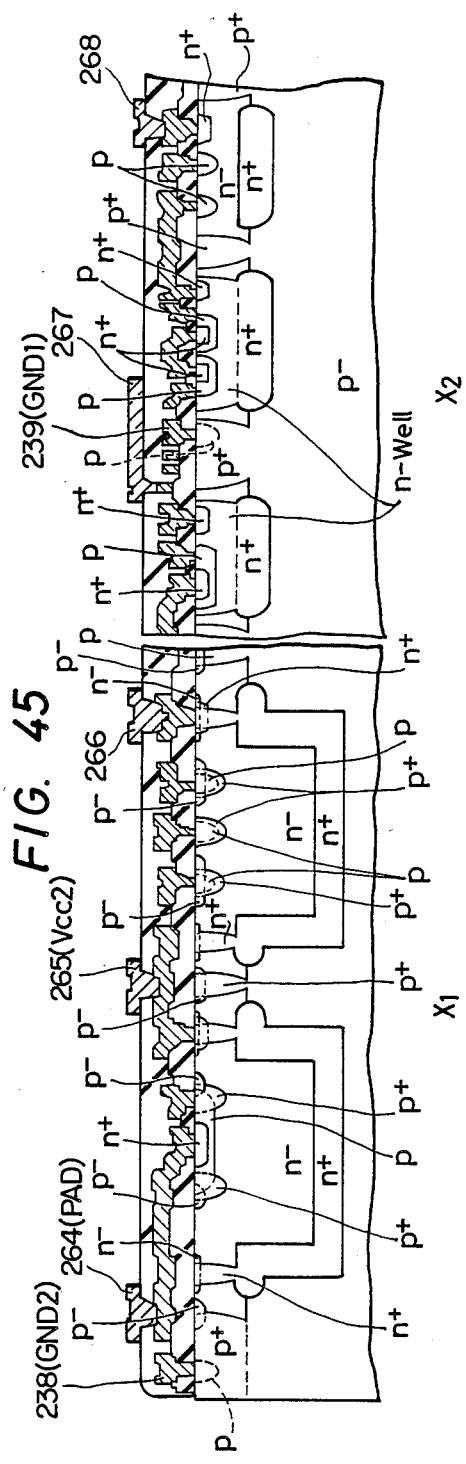

Next, the joint portion between the first and second conductor layers is alloyed at about 400° C. to form the second conductor layers 264 to 267 which are desirably patterned to ohmically contact with the first conductor layer, as shown in FIG. 45. Of these: numeral 264 indicates a bonding pad (which will also be called a "PAD"); numeral 265 the main line ($V_{CC2}$) of 150 to 250 V; and numerals 266, 267 and 268 lines. As shown in FIG. 45, the PAD 264 is formed inside of the ground line GND2 which is formed in the peripheral edge of the chip. The line $V_{CC2}$ is formed between the lines GND2 and GND1. In FIG. 45, the line $V_{CC1}$ (not shown) is formed between the lines $V_{CC2}$ and GND1, as shown in FIG. 17.

The aforementioned arrangements of the lines GND1, GND2, $V_{CC1}$ and $V_{CC2}$ are intended to prevent the low voltage portions and the CSTL element from being electrically affected by the potential applied to the high voltage portions The line GND1 provides the logic ground which is arranged ground and for the CSTL element. The line GND2 is formed in the peripheral edge of the chip and prevents the PAD 264 from being corroded.

Next, an insulating film is formed for providing a final protection film (which will be called a "PRO" film). The PRO film used is made of a polyimide resin, for example, and has a thickness of 2.2 microns.

Figure 46:
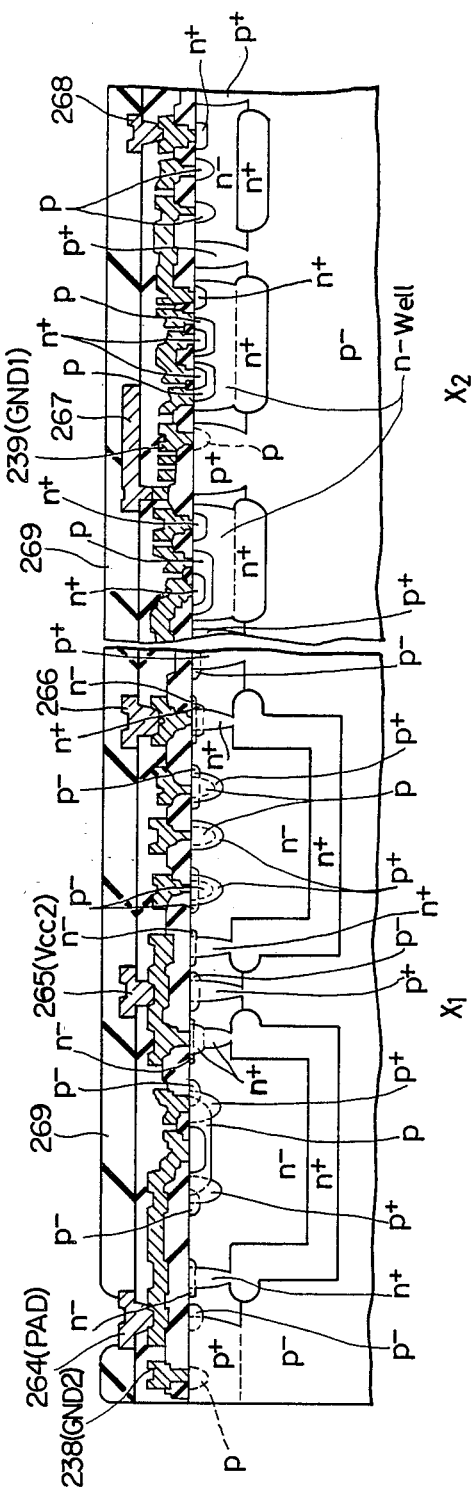

Next, a photo-resist film (not shown) is formed selectively on the PRO film. More specifically, the photo-resist film is formed elsewhere, but not above the PAD 264 and is used as the mask to etch and remove the PRO film on the PAD 264. As shown in FIG. 46, moreover, an IC having the PRO film 269 formed selectively on its surface is completed. This PRO film 269 protects the IC from stress which is generated at the sealing step using a resin and from the ambient atmosphere while the IC is being handled.

According to the present invention, the following effects can be attained:

(1) Since the lightly doped $n^-$-type regions are formed on the surfaces of both the collector electrode leading-out layers of the high voltage NPN transistors and the base electrode leading-out layer of the high voltage PNP transistor, parasitic channels are prevented from being formed, thereby raising the breakdown voltage.

(2) Since the lightly doped $p^-$-type regions are formed in the surfaces of the isolation regions of the high voltage element forming regions, in the peripheral edges of the base region surfaces of the high voltage NPN transistors and in the peripheral edge of the collector region surface of the high voltage PNP transistor, the curvature of the depletion layers extending from the edge portions can be enlarged to raise the breakdown voltage.

(3) Since the impurity concentrations of the collector regions of the low voltage NPN transistor and the NPN transistor of the CSTL element with the clamp diode are increased by the n-well, the parasitic resistances can be reduced to improve the characteristics of the aforementioned low voltage NPN transistor and the CSTL element, for example, to speed up operation.

(4) Due to the above-itemized effects (1), (2) and (3), the characteristics of the respective portions of the IC having the high and low voltage portions in the common chip can be controlled and improved independently of one another.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. A semiconductor integrated circuit device comprising:
   a semiconductor chip;
   a first circuit formed in said semiconductor chip;
   a second circuit formed in said semiconductor chip;
   a high speed logic circuit formed in a central portion of said semiconductor chip;
   a first operating potential line for supplying a first predetermined high-level operating potential to said first circuit;
   a second operating potential line for supplying a first predetermined low-level operating potential to said first circuit;
   a third operating potential line for supplying a second predetermined high-level operating potential to said second circuit;
   a fourth operating potential line for supplying a third predetermined high-level operating potential to said high speed logic circuit; and
   a fifth operating potential line for supplying a second predetermined low-level operating potential to said second circuit,
   wherein said first predetermined high-level operating potential is higher than said second and third predetermined high-level operating potentials, wherein said high speed logic circuit is arranged in a central portion of said chip, wherein said second circuit is arranged to surround said high speed logic circuit, wherein said first circuit is arranged in a peripheral portion of said chip to surround said second circuit, wherein said first operating potential line is arranged adjacent to a periphery of said chip, wherein said third operating potential line is arranged in said chip inside of said first operating potential line, wherein said fourth operating potential line is arranged in said chip inside of said third operating potential line, and wherein said fifth operating potential line is so arranged inside of said first operating potential line as to surround said high speed logic circuit to protect said high speed logic circuit from an electrical field established by said first operating potential line, and wherein said second operating potential line has a major portion thereof arranged between said first operating potential line and said periphery of said chip.

2. A semiconductor integrated circuit device according to claim 1, wherein said high speed logic circuit includes series- and parallel-input type shift registers, and wherein said first circuit includes a plurality of drivers coupled to receive output signals of said shift registers for driving a load in accordance with the output signals of said shift registers.

3. A semiconductor integrated circuit device according to claim 1, wherein said first circuit has first and second elements arranged such that the first elements are larger than said second elements and are arranged in an outermost area of said chip whereas said second elements are arranged closer toward the center of said chip.

4. A semiconductor integrated circuit device according to claim 2, wherein the arrangement of elements composing one of said drivers is symmetrical with that of elements composing another adjacent one of said drivers.

5. A semiconductor integrated circuit device according to claim 1, wherein said first predetermined high-level operating potential is in a range of 150–250 volts, and wherein said second high-level operating potential is about 5 volts.

6. A semiconductor integrated circuit device according to claim 1, wherein said fourth operating potential line is arranged to be surrounded by said fifth operating potential line.

7. A semiconductor integrated circuit device according to claim 1, wherein said fifth operating potential line supplies said second predetermined low-level operating potential to said high speed logic circuit.

8. A semiconductor integrated circuit device according to claim 6, wherein said fifth operating potential line supplies said second predetermined low-level operating potential to said high speed logic circuit.

* * * * *